(12) United States Patent
Mizoguchi

(10) Patent No.: US 10,615,615 B2
(45) Date of Patent: Apr. 7, 2020

(54) MONITORING DEVICE

(71) Applicant: DENSO CORPORATION, Kariya, Aichi-pref. (JP)

(72) Inventor: Hayato Mizoguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 121 days.

(21) Appl. No.: 15/997,957

(22) Filed: Jun. 5, 2018

(65) Prior Publication Data

US 2018/0358820 A1 Dec. 13, 2018

(30) Foreign Application Priority Data

Jun. 7, 2017 (JP) .................................. 2017-112955

(51) Int. Cl.
*H02J 7/00* (2006.01)
*H01M 10/48* (2006.01)
*G01R 31/396* (2019.01)
*G01R 31/3835* (2019.01)
*G01R 19/165* (2006.01)

(52) U.S. Cl.
CPC ...... *H02J 7/0021* (2013.01); *G01R 19/16542* (2013.01); *G01R 31/3835* (2019.01); *G01R 31/396* (2019.01); *H01M 10/482* (2013.01); *H02J 7/0014* (2013.01)

(58) Field of Classification Search
CPC .............. G01R 31/3835; G01R 31/392; G01R 31/3648; H01M 10/441; H01M 10/4228; H01M 10/482
USPC ......................................... 324/434, 426, 425
See application file for complete search history.

(56) References Cited

U.S. PATENT DOCUMENTS

| | | | |
|---|---|---|---|
| 2005/0118497 A1* | 6/2005 | Breen ..................... | H01M 2/34 429/93 |
| 2005/0242820 A1* | 11/2005 | Kume ............... | H01M 10/4285 324/426 |
| 2013/0141107 A1* | 6/2013 | Yuasa .................. | G01R 31/382 324/426 |
| 2013/0342939 A1 | 12/2013 | Itou et al. | |
| 2015/0111073 A1 | 4/2015 | Deriha et al. | |

(Continued)

FOREIGN PATENT DOCUMENTS

| | | |
|---|---|---|
| JP | 2014-228302 A | 12/2014 |
| JP | 2015-118731 A | 6/2015 |
| JP | 2017-027831 A | 2/2017 |

*Primary Examiner* — Giovanni Astacio-Oquendo
(74) *Attorney, Agent, or Firm* — Oliff PLC

(57) ABSTRACT

A monitoring device includes a first monitoring section that monitors voltages of the plurality of battery cells connected in series and a first wiring section electrically connects the monitoring section and a plurality of battery cells. A first electrode terminal group and a second electrode terminal group in which a plurality of positive terminals and a plurality of negative terminals are aligned and alternate in a longitudinal direction are aligned in a horizontal direction by aligning the plurality of battery cells in the longitudinal direction. The first wiring section is provided with a front wiring section and a back wiring section having a both-end wiring pattern electrically connected to electrode terminals of two battery cells positioned at both ends of the plurality of battery cells aligned in the longitudinal direction and an even-number wiring pattern connected to electrode terminals of even-numbered battery cells in an aligning order.

10 Claims, 13 Drawing Sheets

(56) References Cited

U.S. PATENT DOCUMENTS

2016/0061909 A1 3/2016 Iino et al.
2016/0284444 A1 9/2016 Naito

* cited by examiner

MONITORING DEVICE

CROSS-REFERENCE TO RELATED APPLICATION

This application is based on and claims the benefit of priority from earlier Japanese Patent Applications No. 2017-112955 filed Jun. 7, 2017, the description of which is incorporated herein by reference.

TECHNICAL FIELD

The present disclosure relates to a monitoring device for battery cells.

BACKGROUND

A battery module having a single cell group in which a plurality of single cells each of which having a positive terminal and a negative terminal which are aligned side by side, and a battery wiring module attached to the group is known as disclosed in Japanese Patent Application Laid-Open Publication No. 2017-27831 (Patent Document 1).

The battery wiring module includes a battery wiring module attached to a front side of the battery module and another battery wiring module attached to a rear side of the battery module.

Each of the two battery wiring modules includes a plurality of bus bars and a flexible printed circuit board.

In the following description, in order to distinguish two battery wiring modules, a battery wiring module attached to a front side of the battery module is referred to as a first battery wiring module. In addition, a battery wiring module attached to the rear side of the battery module is referred to as a second battery wiring module.

The bus bars of the first battery wiring module and the second battery wiring module respectively connect positive terminals and negative terminals of different single cells. For this purpose, each bus bar has two terminal insertion holes into which positive terminals and negative terminals of different unit cells are inserted.

However, one terminal insertion hole is formed in the two bus bars at both ends of the second battery wiring module. One of the two bus bars at both ends is connected to the electrode terminal of the positive electrode. A positive voltage obtained by summing the voltages of the individual cells is outputted from the electrode terminal of the positive electrode.

Further, the other of the two bus bars at both ends is connected to the electrode terminal of the negative electrode. The electrode terminal of this negative electrode is at a ground potential.

Each of the flexible printed circuit boards of the first battery wiring module and the second battery wiring module includes a plurality of voltage detection wirings for detecting the voltage of each cell. The plurality of voltage detection wirings are connected to the bus bars.

As described above, shapes of the bus bars are different between the first battery wiring module and the second battery wiring module.

Accordingly, the voltage detection wirings of the first battery wiring module and the flexible printed circuit board of the second battery wiring module have different shapes.

Therefore, the first battery wiring module cannot be used in place of the second battery wiring module. Conversely, the second battery wiring module cannot be used in place of the first battery wiring module.

As a result, the battery wiring module (wiring section) has a low versatility.

SUMMARY

An embodiment provides a versatile monitoring device for wiring sections.

One aspect of the present disclosure is a monitoring device including a monitoring section that monitors a voltage of each of a plurality of battery cells of a battery stack in which the plurality of battery cells are electrically and mechanically connected in series in a longitudinal direction orthogonal to a height direction passing through an upper surface of the battery cell where electrode terminals are formed, and a wiring section electrically connecting the monitoring section and the plurality of battery cells.

Each battery cell has a positive terminal and a negative terminal as the electrode terminals aligned in a lateral direction orthogonal to the height direction and the longitudinal direction.

A first electrode terminal group in which a plurality of the positive terminals and the negative terminals are aligned and alternate in the longitudinal direction and a second electrode terminal group in which the negative terminal and the positive terminal are aligned and alternate in the longitudinal direction are formed in the battery stack by aligning the plurality of the battery cells in the longitudinal direction.

The first electrode terminal group and the second electrode terminal group are aligned in the lateral direction.

The wiring section has a first wiring section and a second wiring section.

Each of the first wiring section and the second wiring section has a flexible circuit board having flexibility and a wiring pattern formed on the flexible circuit board.

Each of the first wiring section and the second wiring section has flexible the circuit board having the same shape and the wiring pattern having the same shape.

The wiring pattern has both-end wiring patterns and at least one of an even-number wiring pattern and an odd-number wiring pattern, the both-end wiring patterns are electrically connected to electrode terminals of two battery cells positioned at both ends of the plurality of battery cells aligned in the longitudinal direction, the even-number wiring patterns are connected to electrode terminals of even-numbered battery cells in an aligning order excluding the two battery cells positioned at both ends, the odd-number wiring pattern is connected to electrode terminals of odd-numbered battery cells in the aligning order excluding two battery cells positioned at both ends.

The first electrode terminal group and the monitoring section are electrically connected via the wiring pattern of one of the first wiring section and the second wiring section.

The second electrode terminal group and the monitoring section are electrically connected via the wiring pattern of another one of the first wiring section and the second wiring section.

As described above, the alignment of the positive terminal and the negative terminal of the first electrode terminal group and the second electrode terminal group are different.

However, each of the first wiring section and the second wiring section has the same wiring pattern. This wiring pattern has both-end wiring patterns, and at least one of the even-number wiring pattern and the odd-number wiring pattern.

According to the even-number wiring pattern, one of the positive terminal and the negative terminal of the first electrode terminal group in the even-numbered battery cells can be electrically connected to the monitoring section.

Similarly, the other one of the positive terminal and the negative terminal of the second electrode terminal group of the even-numbered battery cells can be electrically connected to the monitoring section.

Then, with the both-end wiring patterns, the electrodes of the battery cells at both ends of each of the first electrode terminal group and the second electrode terminal group can be electrically connected to the monitoring section. As a result, the voltages of all the battery cells can be detected.

According to the odd-number wiring pattern, the other one of the positive terminal and the negative terminal of the first electrode terminal group in the odd-numbered battery cells can be electrically connected to the monitoring section.

Similarly, one of the negative terminal and the positive terminal of the second electrode terminal group in the odd-numbered battery cells can be electrically connected to the monitoring section.

Then, the electrodes of the battery cells at both ends of each of the first electrode terminal group and the second electrode terminal group can be electrically connected to the monitoring section by the both-end wiring patterns. As a result, the voltages of all the battery cells can be detected.

The first wiring section and the second wiring section have a flexible circuit board and a wiring pattern having the same shape. Then, the wiring pattern has both-end wiring patterns and at least one of the even-number wiring pattern and the odd-number wiring pattern.

Therefore, the first electrode terminal group and the monitoring section are electrically connected via one of the first wiring section and the second wiring section.

In addition, the second electrode terminal group and the monitoring section are electrically connected via the other one of the first wiring section and the second wiring section. Thereby, the voltages of all the battery cells can be detected.

As described above, the first electrode terminal group and the monitoring section, or the second electrode terminal group and the monitoring section can be electrically connected by either the first wiring section or the second wiring section.

Therefore, the first wiring section can be used in place of the second wiring section. Conversely, the second wiring section can be used in place of the first wiring section.

In the present disclosure, the wiring section has a high versatility.

The battery stack is formed by connecting the plurality of battery cells in series in the longitudinal direction, and therefore, there is a possibility that the alignment thereof is somewhat disturbed due to manufacturing variations.

As a result, the alignment of the positive terminal and the negative terminal in each of the first electrode terminal group and the second electrode terminal group may also be somewhat disturbed.

For this, the flexible circuit board on which the wiring pattern is formed has flexibility.

Therefore, it is possible to electrically connect the wiring pattern and the electrode terminal by deforming the flexible circuit board accordingly even if disturbance occurs between the positive terminal and the negative terminal.

DETAILED DESCRIPTION OF THE PREFERRED EMBODIMENTS

Hereinafter, an embodiment in which the present disclosure is applied to a hybrid vehicle will be described with reference to the drawings.

First Embodiment

A battery pack according to the present embodiment will be described with reference to FIGS. 1 to 7.

Hereinafter, three directions orthogonal to each other are indicated as a lateral direction, a longitudinal direction, and a height direction.

In the present embodiment, the lateral direction is along a travelling direction (forward/backward) of the hybrid vehicle. The longitudinal direction is along a left-right direction of the hybrid vehicle. The height direction is along a top-bottom direction of the hybrid vehicle.

[Overview of Battery Pack]

Figure 1:
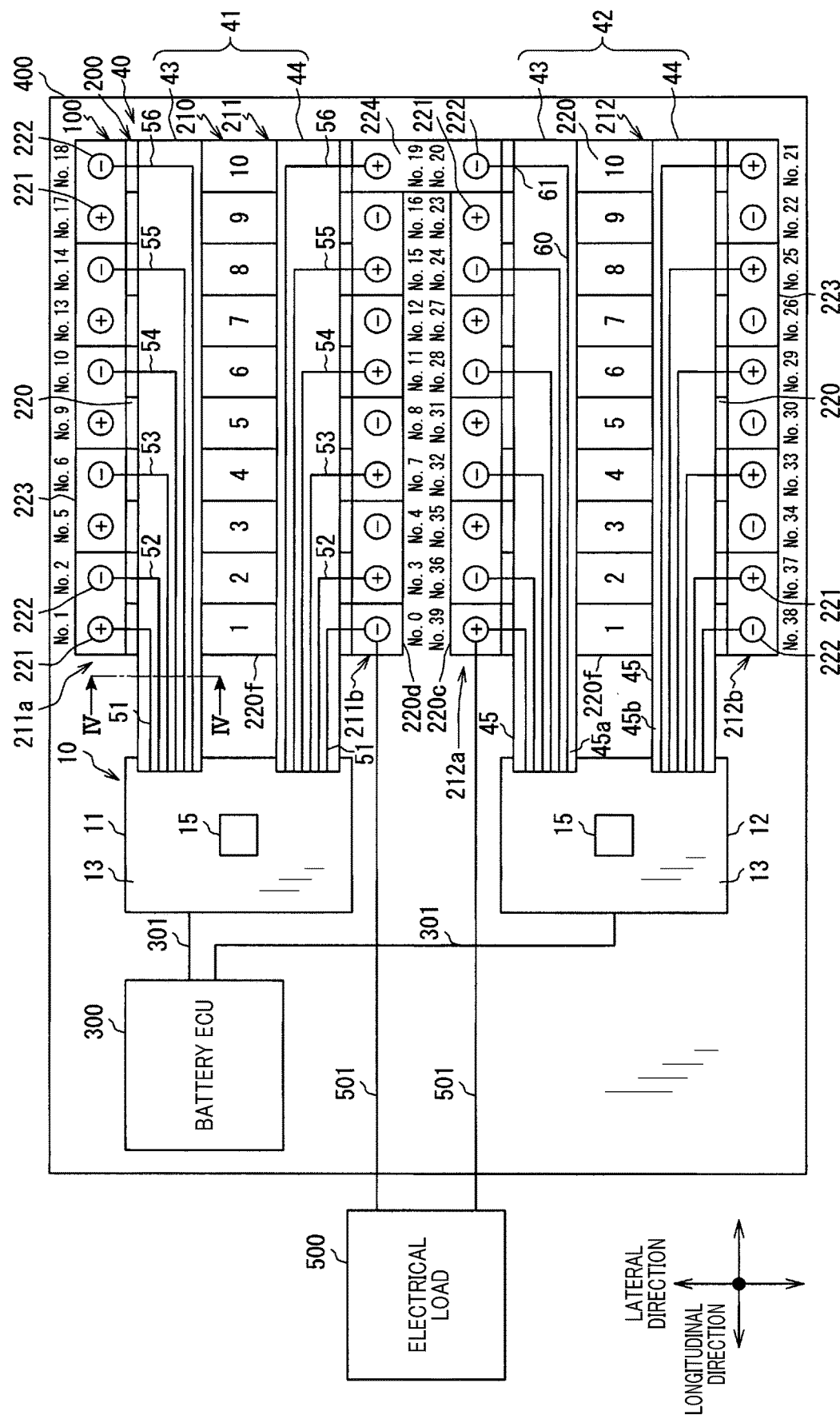
FIG. 1 shows a schematic diagram for explaining a battery pack.

A battery pack 400 functions to supply electric power to an electric load 500 of the hybrid vehicle shown in FIG. 1. The electric load 500 includes a motor generator that functions as a power supply source and a power generation source.

For example, when the motor generator runs on battery power, the battery pack 400 discharges and supplies power to the motor generator. When the motor generator generates power, the battery pack 400 is charged with the power generated by the power generation.

The battery pack 400 has a battery ECU 300. The battery ECU 300 is electrically connected to various ECUs (in-vehicle ECUs) mounted in the hybrid vehicle.

The battery ECU 300 and in-vehicle ECUs mutually transmit and receive signals to cooperatively control the hybrid vehicle.

The battery pack 400 has a battery module 200. The battery module 200 has a battery stack 210 in which a plurality of battery cells 220 are electrically connected in series.

The battery pack 400 has a monitoring device 100. The monitoring device 100 monitors the voltage of each battery cell 220 constituting the battery stack 210.

As described above, the battery pack 400 includes the monitoring device 100, the battery module 200, and the battery ECU 300.

Besides these, the battery pack 400 may have a blower fan for cooling the battery module 200. Driving of the blower fan is controlled by the battery ECU 300.

The battery pack 400 is disposed in, for example, a space under a seat of the hybrid vehicle. This space is wider under a rear seat than under a front seat. The battery pack 400 of the present embodiment is disposed in a space under the rear seat.

Hereinafter, the battery module 200 and the monitoring device 100 will be described.

[Overview of Battery Module]

Figure 2:
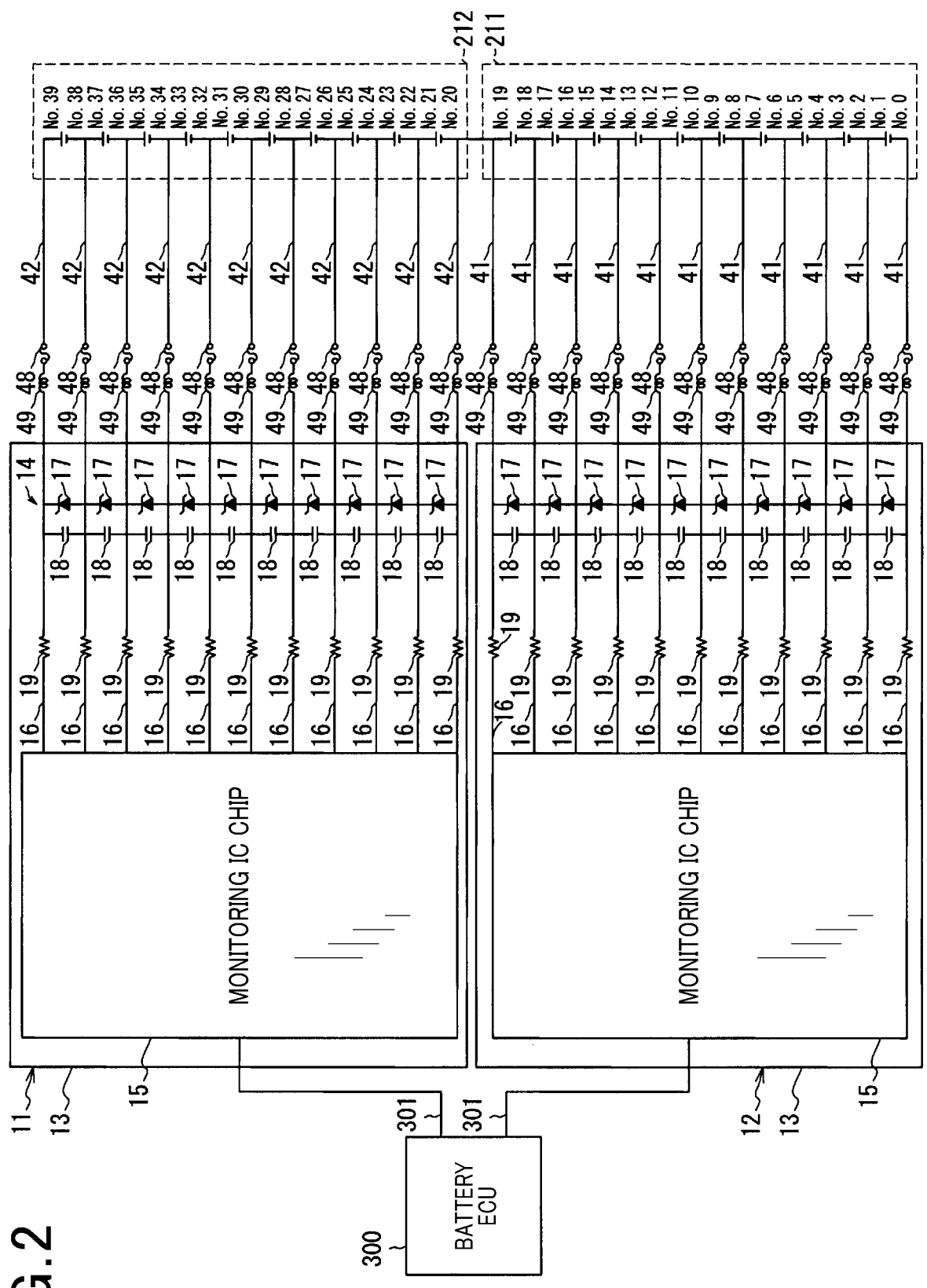
FIG. 2 shows a circuit diagram of the battery pack.

As shown in FIG. 1 and FIG. 2, the battery module 200 has a first battery stack 211 and a second battery stack 212 as a battery stack 210.

In addition, although not shown, the battery module 200 has a casing that accommodates the first battery stack 211 and the second battery stack 212. This casing is formed by aluminum die casting.

The casing is formed in a box shape with an opening in the height direction and a bottom. The casing has a first storage space and a second storage space that are divided into two in the lateral direction.

The first battery stack 211 is disposed in the first storage space. The second battery stack 212 is disposed in the second storage space.

As a result, the first battery stack 211 and the second battery stack 212 are arranged side by side.

Note that the opening of the casing is covered with a lid. A flow path through which cooling air circulates is formed inside the casing. At least one of the casing and the lid is disposed with a communication hole for communicating an external atmosphere with the flow path.

Each of the first battery stack 211 and the second battery stack 212 has a plurality of battery cells 220. The plurality of battery cells 220 are aligned side by side in the longitudinal direction. The plurality of battery cells 220 are electrically and mechanically connected in series.

The first battery stack 211 and the second battery stack 212 are electrically connected in series. Therefore, the output voltage of the battery module 200 is the sum of the output voltages of the plurality of battery cells 220 of the first battery stack 211 and the second battery stack 212.

[Overview of Monitoring Device]

As shown in FIG. 1, the monitoring device 100 includes a monitoring section 10 that monitors voltages of the plurality of battery cells 220, and a wiring section 40 that electrically connects the monitoring section 10 and the plurality of battery cells 220.

Each of the monitoring section 10 and the wiring section 40 is disposed in the battery module 200. Specifically, the monitoring section 10 is disposed above or side of the battery stack 210. The wiring section 40 is disposed above the battery stack 210.

The monitoring device 100 includes a first monitoring section 11 and a second monitoring section 12 as the monitoring section 10. The first monitoring section 11 corresponds to the first battery stack 211, and the second monitoring section 12 corresponds to the second battery stack 212.

The monitoring device 100 has a first wiring section 41 and a second wiring section 42 as the wiring section 40. The first wiring section 41 corresponds to the first battery stack 211, and the second wiring section 42 corresponds to the second battery stack 212.

The first wiring section 41 connects at least one of the positive terminal 221 and the negative terminal 222 of the plurality of battery cells 220 of the first battery stack 211 to the first monitoring section 11.

The second wiring section 42 connects at least one of the positive terminal 221 and the negative terminal 222 of the plurality of battery cells 220 of the second battery stack 212 to the second monitoring section 12.

[Structure of Battery Stack]

Next, the first battery stack 211 and the second battery stack 212 will be described in detail with reference to FIGS. 1 to 3.

As described above, each of the first battery stack 211 and the second battery stack 212 has the plurality of battery cells 220. The battery cell 220 has a quadrangular prism shape. Therefore, the battery cell 220 has six surfaces.

Figure 3:
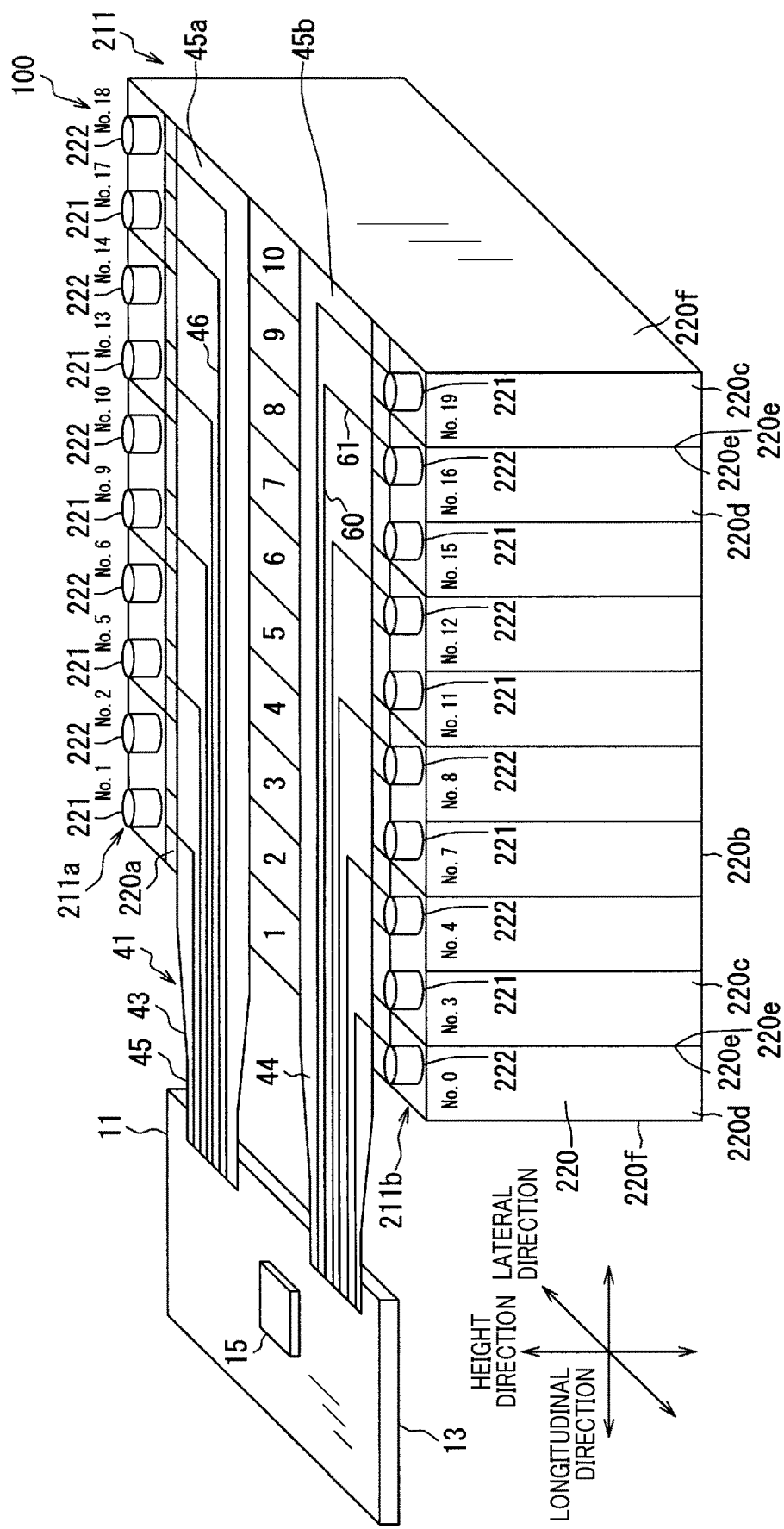
FIG. 3 shows a partial perspective view of the battery pack.

As shown in FIG. 3, the battery cell 220 has an upper surface 220a and a lower end surface 220b facing in the height direction. The battery cell 220 has a first side surface 220c and a second side surface 220d facing in the lateral direction. The battery cell 220 has a first main surface 220e and a second main surface 220f facing in the longitudinal direction.

Among these six surfaces, the first main surface 220e and the second main surface 220f are larger in area than the other surfaces.

The battery cell 220 is a secondary battery. Specifically, the battery cell 220 is a lithium ion battery. The lithium ion battery generates induced voltage by chemical reaction. A current flows through the battery cell 220 by an induced voltage being generated.

As a result, the battery cell 220 generates heat. The battery cell 220 expands as well.

As described above, the areas of the first main surface 220e and the second main surface 220f of the battery cell 220 are larger than those of the other surfaces.

Therefore, the first main surface 220e and the second main surface 220f of the battery cell 220 are easily expanded. As a result, the battery cell 220 expands in the longitudinal direction. That is, the battery cell 220 expands in a direction in which the plurality of battery cells 220 are aligned.

Each of the first battery stack 211 and the second battery stack 212 has a restraining tool (not shown). By means of this restraining tool, the plurality of battery cells 220 are mechanically connected in series in the longitudinal direction.

In addition, this restraining tool suppresses the physical size of each of the first battery stack 211 and the second battery stack 212 from increasing due to the expansion of each of the plurality of battery cells 220.

It should be noted that gaps are formed between adjacent battery cells 220. Heat dissipation of each battery cell 220 is promoted as air passes through these gaps.

A positive terminal 221 and a negative terminal 222 are formed on the upper surface 220a of the battery cell 220.

The positive terminal 221 and the negative terminal 222 are aligned in the lateral direction. The positive terminal 221 is positioned near the first side surface 220c.

The negative terminal 222 is positioned near the second side surface 220d. The positive terminal 221 and the negative terminal 222 correspond to electrode terminals.

Next, the arrangement of the battery cells 220 of the first battery stack 211 and the second battery stack 212 will be described in detail.

As shown in FIG. 1, the first battery stack 211 and the second battery stack 212 are respectively aligned in the longitudinal direction with the battery ECU 300. For the sake of convenience of description, numbers are assigned in the following description to each of the plurality of battery cells 220 such that the number increases as the distance from the battery ECU 300 increases in the longitudinal direction. Needless to say that these numbers have no special meanings.

For example, numbers that increase in number in the longitudinal direction as they approach the battery ECU 300 may be assigned to each of the plurality of battery cells 220.

The first battery stack 211 and the second battery stack 212 have the same number of even-number of battery cells 220. That is, assuming that N is a natural number of 1 or more, the first battery stack 211 and the second battery stack 212 have 2N battery cells 220.

A first battery cell 220 is positioned closest to the battery ECU 300 in the longitudinal direction. A 2Nth battery cell 220 is the most distant from the battery ECU 300 in the longitudinal direction.

As shown in FIGS. 1 and 3, the second main surface 220*f* of the first battery cell 220 of each of the first battery stack 211 and the second battery stack 212 faces the battery ECU 300.

The second side surface 220*d* of the first battery cell 220 of the first battery stack 211 faces the second battery stack 212 side. The first side surface 220*c* of the first battery cell 220 of the second battery stack 212 faces the first battery stack 211 side.

Therefore, the negative terminal 222 of the first battery cell 220 of the first battery stack 211 is positioned on the second battery stack 212 side of the battery stack 210. The positive terminal 221 of the first battery cell 220 of the first battery stack 211 is positioned away from the second battery stack 212 in the lateral direction.

The positive terminal 221 of the first battery cell 220 of the second battery stack 212 is positioned on the first battery stack 211 side of the battery stack 210. The negative terminal 222 of the first battery cell 220 of the second battery stack 212 is positioned away from the first battery stack 211 in the lateral direction.

As shown in FIG. 3, the first main surface 220*e* of the second battery cell 220 faces the first main surface 220*e* of the first battery cell 220 in the longitudinal direction. Therefore, the positive terminal 221 of the first battery cell 220 and the negative terminal 222 of the second battery cell 220 are aligned in the longitudinal direction.

The negative terminal 222 of the first battery cell 220 and the positive terminal 221 of the second battery cell 220 are aligned in the longitudinal direction.

In the same manner, the two battery cells 220 are aligned in the longitudinal direction with neighboring cells mutually reversed in the lateral direction, such that positive and negative terminals alternate along the longitudinal direction.

In the first battery stack 211, a first electrode terminal group 211*a* in which 2N of positive terminals 221 and negative terminals 222 are aligned and alternate in the longitudinal direction is formed.

In addition, a second electrode terminal group 211*b* in which 2N of negative terminals 222 and positive terminals 221 are aligned and alternate in the longitudinal direction is formed.

Alignments of the positive terminals 221 and the negative terminals 222 are opposite between the first electrode terminal group 211*a* and the second electrode terminal group 211*b*.

The first electrode terminal group 211*a* and the second electrode terminal group 211*b* are aligned in the lateral direction.

Likewise, in the second battery stack 212, a third electrode terminal group 212*a* in which 2N of positive terminals 221 and negative terminals 222 are aligned and alternate in the longitudinal direction is formed.

In addition, a fourth electrode terminal group 212*b* in which 2N of negative terminals 222 and positive terminals 221 are aligned and alternate in the longitudinal direction is formed.

Alignments of the positive terminals 221 and the negative terminals 222 are opposite between the third electrode terminal group 212*a* and the fourth electrode terminal group 212*b*.

The third electrode terminal group 212*a* and the fourth electrode terminal group 212*b* are aligned in the lateral direction.

The first electrode terminal group 211*a* and the third electrode terminal group 212*a* correspond to a first electrode terminal group recited in the claims.

Further, the second electrode terminal group 211*b* and the fourth electrode terminal group 212*b* correspond to a second electrode terminal group recited in the claims.

One of the positive terminals 221 and one of negative terminals 222 which are aligned side by side in the longitudinal direction among the electrode terminals constituting each of the electrode terminal groups described above are electrically connected via a first serial terminal 223 extending in the longitudinal direction.

As a result, the plurality of battery cells 220 constituting the first battery stack 211 are electrically connected in series.

In addition, the plurality of battery cells 220 constituting the second battery stack 212 are electrically connected in series.

However, a connection relationship between the first battery stack 211 and the second battery stack 212 is reversed.

In the first battery stack 211, the positive terminal 221 of the first battery cell 220 and the negative terminal 222 of the second battery cell 220 are electrically connected via the first serial terminal 223.

In the second battery stack 212, the negative terminal 222 of the first battery cell 220 and the positive terminal 221 of the second battery cell 220 are electrically connected via the first serial terminal 223.

Hereinafter, the electrical connection between the second and subsequent battery cells 220 via the first serial terminal 223 is also reversed between the first battery stack 211 and the second battery stack 212.

The first main surface 220*e* of the 2Nth battery cell 220, which is farthest from the battery ECU 300 among the first battery stack 211 and the second battery stack 212, faces the first main surface 220*e* of the 2N−1th battery cell 220 in the longitudinal direction.

Accordingly, the positive terminal 221 of the 2Nth battery cell 220 of the first battery stack 211 is positioned on the second battery stack 212 side of the battery stack 210.

The negative terminal 222 of the 2Nth battery cell 220 of the second battery stack 212 is positioned on the first battery stack 211 side of the battery stack 210.

The positive terminal 221 of the 2Nth battery cell 220 and the negative terminal 222 of the 2Nth battery cell 220 of the second battery stack 212 are electrically connected via a second series terminal 224 extending in the lateral direction.

Thereby, the first battery stack 211 and the second battery stack 212 are electrically connected in series.

Note that the positive terminal 221 of the 2Nth battery cell 220 of the first battery stack 211 and the negative terminal 222 of the 2Nth battery cell 220 of the second battery stack 212 may be connected by a wire instead of the second series terminals 224.

As described above, the negative terminal 222 of the first battery cell 220 of the first battery stack 211 is positioned on the second battery stack 212 side of the battery stack 210. The positive terminal 221 of the first battery cell 220 of the second battery stack 212 is positioned on the first battery stack 211 side of the battery stack 210.

The negative terminal 222 of the first battery cell 220 of the first battery stack 211 has a ground potential (the lowest potential) when externally connected to ground. The positive terminal 221 of the first battery cell 220 of the second battery stack 212 has a potential obtained by summing the outputs of the respective battery cells 220 (the highest potential).

The negative terminal 222 having the lowest potential and the positive terminal 221 having the highest potential are connected to the electric load 500 via bus bars 501. As a result, the potential difference between the lowest potential and the highest potential is outputted to the electrical load 500 as the output voltage of the battery module 200.

Note that the negative terminal 222 of the lowest potential and the positive terminal 221 of the highest potential may be connected to the electrical load 500 via wire harnesses.

[Configuration of Monitoring Device]

Next, the monitoring device 100 will be described in detail with reference to FIGS. 1 to 7.

As described above, the monitoring device 100 has the first monitoring section 11 and the first wiring section 41 corresponding to the first battery stack 211. The monitoring device 100 has the second monitoring section 12 and the second wiring section 42 corresponding to the second battery stack 212.

As shown in FIG. 1, each of the first monitoring section 11 and the second monitoring section 12 has a printed circuit board 13, electronic elements 14, and a monitoring IC chip 15.

The electronic elements 14 and the monitoring IC chip 15 are mounted on the printed circuit board 13. The electronic elements 14 and the monitoring IC chip 15 are electrically connected to each other through board wirings 16 of the printed circuit board 13.

As shown in FIG. 1, the first wiring section 41 is connected to the printed circuit board 13 of the first monitoring section 11. The second wiring section 42 is connected to the printed circuit board 13 of the second monitoring section 12.

Thus, the first battery stack 211 and the first monitoring section 11 are electrically connected via the first wiring section 41. Further, the second battery stack 212 and the second monitoring section 12 are electrically connected via the second wiring section 42.

It should be noted that, although not shown, a connector is disposed on the printed circuit board 13 of each of the first monitoring section 11 and the second monitoring section 12. A wire 301 is connected to this connector. This wire 301 is connected to the battery ECU 300.

Thereby, each the first monitoring section 11 and the second monitoring section 12 is connected to the battery ECU 300.

Each of the first wiring section 41 and the second wiring section 42 has a front wiring section 43 and a back wiring section 44. Each of the front wiring section 43 and the back wiring section 44 has a flexible circuit board 45 having flexibility and a wiring pattern 46 formed on the flexible circuit board 45.

Figure 4:
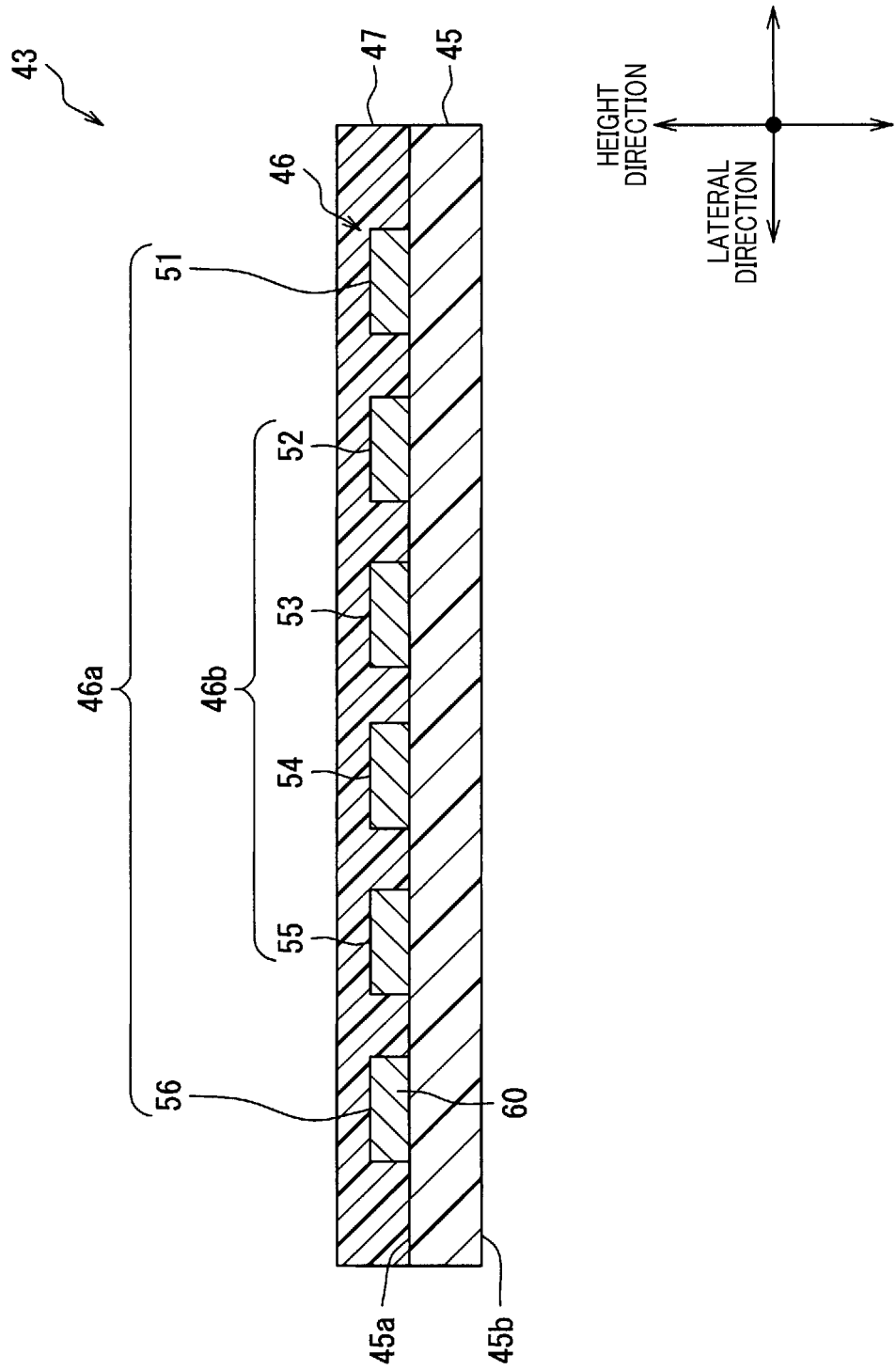
FIG. 4 shows a sectional view taken along a line IV-IV shown in FIG. 1.

As shown in FIG. 4, the wiring pattern 46 is formed on a front surface 45a of the flexible circuit board 45. The wiring pattern 46 is covered with a coating resin 47.

Figure 5:
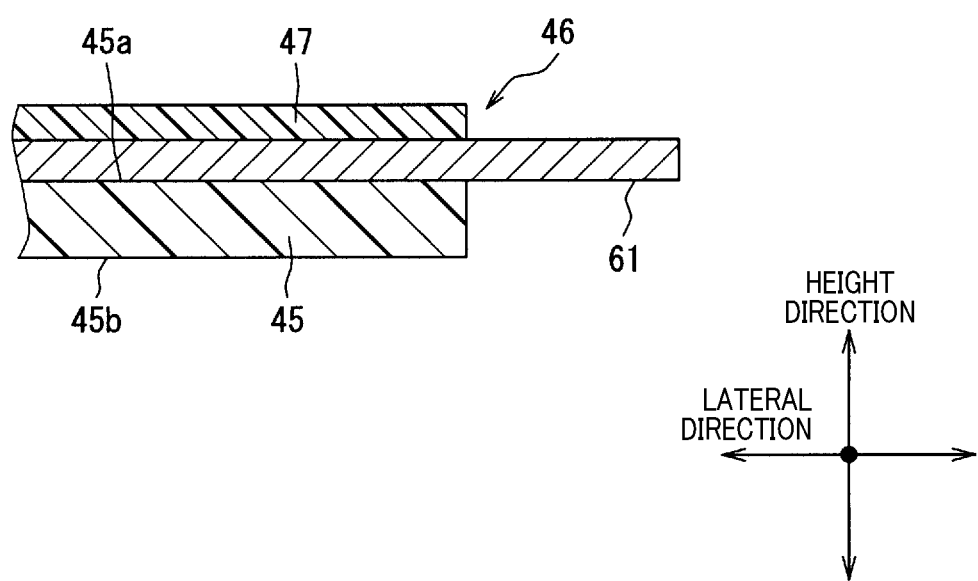
FIG. 5 shows a sectional view for explaining an end portion of a wiring pattern.

However, as shown in FIG. 5, an end portion of the wiring pattern 46 protrudes out from the flexible circuit board 45 and the coating resin 47, and is exposed. The end portion of the wiring pattern 46 is mechanically and electrically connected to the corresponding electrode terminal of the battery cell 220 by welding or the like.

It should be noted that the end portion of the wiring pattern 46 need not be directly connected to the corresponding electrode terminal. The end portion of the wiring pattern 46 may be directly connected to the first serial terminal 223 and the second series terminal 224 which are electrically connected to the corresponding electrode terminal.

By this also, the wiring pattern 46 is electrically connected to the corresponding electrode terminal.

The front wiring section 43 and the back wiring section 44 have the same shape. Therefore, the flexible circuit board 45 and the wiring pattern 46 of the front wiring section 43 are the same as the flexible circuit board 45 and the wiring pattern 46 of the back wiring section 44.

The front wiring section 43 and the back wiring section 44 correspond to a first wiring section and a second wiring section, respectively, described in the claims.

Manners in which the front wiring section 43 and the back wiring section 44 are mounted on the battery stack 210 are different.

The front wiring section 43 is mounted on the battery stack 210 in such a manner that a back surface 45b of the flexible circuit board 45 faces the upper surface 220a of the battery cell 220. The back wiring section 44 is mounted on the battery stack 210 in such a manner that the front surface 45a of the flexible circuit board 45 faces the upper surface 220a.

In this manner, the front wiring section 43 and the back wiring section 44 are reversed from each other in the arrangement on the battery stack 210.

As described above, the end portion of the wiring pattern 46 protrudes out from both the flexible circuit board 45 and the coating resin 47.

Therefore, even if the front and back surfaces of the flexible circuit board 45 are reversed, the flexible circuit board 45 and the coating resin 47 are not positioned between the end portion of the wiring pattern 46 and the electrode terminal.

Above the first battery stack 211, the front wiring section 43 and the back wiring section 44 of the first wiring section 41 are disposed between the first electrode terminal group 211a and the second electrode terminal group 211b.

The front wiring section 43 is disposed on the first electrode terminal group 211a side of the battery stack 210. The back wiring section 44 is disposed on the second electrode terminal group 211b side of the battery stack 210. The front wiring section 43 is electrically connected to the first electrode terminal group 211a. The back wiring section 44 is electrically connected to the second electrode terminal group 211b.

Above the second battery stack 212, the front wiring section 43 and the back wiring section 44 of the second wiring section 42 are disposed between the third electrode terminal group 212a and the fourth electrode terminal group 212b.

The front wiring section 43 is disposed on the third electrode terminal group 212a side of the battery stack 210. The back wiring section 44 is disposed on the fourth electrode terminal group 212b side of the battery stack 210. The front wiring section 43 is electrically connected to the third electrode terminal group 212a. The back wiring section 44 is electrically connected to the fourth electrode terminal group 212b.

The wiring pattern 46 formed on the flexible circuit board 45 of each of the front wiring section 43 and the back wiring section 44 has the following wiring.

That is, the wiring pattern 46 has a both-end wiring pattern 46a connected to the electrode terminals of the first and 2Nth battery cells 220 positioned at both ends of 2N battery cells 220 aligned in the longitudinal direction.

Further, the wiring pattern 46 has an even-number wiring pattern 46b connected to the electrode terminals of the even-numbered battery cells 220 in the aligning order excluding the two battery cells 220 positioned at both ends. The total number of wirings that each of the both-end wiring pattern 46a and the even-number wiring pattern 46b has is N+1.

As described above, the alignment of the positive terminals 221 and the negative terminal 222s are different between the first electrode terminal group 211a and the second electrode terminal group 211b.

Therefore, polarities of the electrode terminals connected to the both-end wiring pattern 46a of the front wiring section 43 and the electrode terminals connected to the both-end wiring pattern 46a of the back wiring section 44 are different from each other.

Likewise, polarities of the electrode terminals connected to the even-number wiring pattern 46b of the front wiring section 43 and the electrode terminals connected to the even-number wiring pattern 46b of the back wiring section 44 are different from each other.

Specifically, the both-end wiring pattern 46a of the front wiring section 43 connected to the first electrode terminal group 211a is connected to the positive terminal 221 of the first battery cell 220, and is connected to the negative terminal 222 of the 2Nth battery cell 220.

On the other hand, the both-end wiring pattern 46a of the back wiring section 44 connected to the second electrode terminal group 211b is connected to the negative terminal 222 of the first battery cell 220, and is connected to the positive terminal 221 of the 2Nth battery cell 220.

The even-number wiring pattern 46b of the front wiring section 43 connected to the first electrode terminal group 211a is connected to the negative terminals 222 of the even-numbered battery cells 220 except the one in the end.

On the other hand, the even-number wiring pattern 46b of the back wiring section 44 connected to the second electrode terminal group 211b is connected to the positive terminals 221 of the even-numbered battery cells 220 except the one at the end.

As described above, the wiring pattern 46 of each of the front wiring section 43 and the back wiring section 44 of the first wiring section 41 is connected to at least one of the positive terminal 221 and the negative terminal 222 of the two battery cells 220 aligned in the longitudinal direction.

The voltages of all the battery cells 220 constituting the first battery stack 211 can be detected by the first wiring section 41.

The second battery stack 212 and the first battery stack 211 have the same structure.

Then, the connection and disposition of the second wiring section 42 to the second battery stack 212 is the same as the connection and disposition of the first wiring section 41 to the first battery stack 211. Therefore, the voltages of all the battery cells 220 constituting the second battery stack 212 can be detected by the second wiring section 42.

In the present embodiment, the natural number N is 5. Therefore, each of the first battery stack 211 and the second battery stack 212 has ten battery cells 220.

The total number of wirings that each of the both-end wiring pattern 46a and the even-number wiring pattern 46b has is six. The six wires are aligned in the lateral direction as shown in FIGS. 1 and 4.

In the following description, these six wires are numbered from the end of the battery cell 220 where the electrode terminals are formed towards a center of the battery cell 220 with increasing numbers, and they are numbered as a first wiring 51, a second wiring 52, a third wiring 53, a fourth wiring 54, a fifth wiring 55, and a sixth wiring 56.

The first wiring 51 in the first and the sixth wiring 56 in the last are included in the both-end wiring pattern 46a. The remaining second wiring 52, the third wiring 53, the fourth wiring 54, and the fifth wiring 55 are included in the even-number wiring pattern 46b.

Each of the first wiring 51, the second wiring 52, the third wiring 53, the fourth wiring 54, the fifth wiring 55, and the sixth wiring 56 includes a longitudinal section 60 extending in the longitudinal direction, and a lateral section 61 extending in the lateral direction toward the end side from the center of the battery cell 220.

An end of the longitudinal section 60 is electrically connected to the monitoring section 10. An end of the lateral section 61 is integrally connected to another end of the longitudinal section 60. Another end of the lateral section 61 is electrically connected to the corresponding electrode terminal.

As shown in FIG. 5, the other end of the lateral section 61 protrudes out from the flexible circuit board 45 and the coating resin 47. The other end of the lateral section 61 corresponds to the end portion of the wiring pattern 46 protruding out from the flexible circuit board 45 and the coating resin 47.

As shown in FIG. 1, the flexible circuit board 45 has a long rectangular shape in the longitudinal direction. The other ends of the lateral sections 61 extend from a side along the longitudinal direction of the flexible circuit board 45 to the corresponding electrode terminal group. The other ends of the plurality of lateral sections 61 are aligned in the longitudinal direction.

The lateral sections 61 are positioned between the longitudinal sections 60 and the corresponding electrode terminal group in the lateral direction.

Then, the lateral length of the lateral section 61 is longer than the lateral separation distance between a connection end (the other end) of the longitudinal section 60 to the lateral section 61 and the corresponding electrode terminal group.

Next, connection between the above six wires and corresponding electrode terminals will be described with reference to FIG. 1.

In the front wiring section 43, the first wiring 51 is electrically connected to the positive terminal 221 of the first battery cell 220; the second wiring 52 is electrically connected to the negative terminal 222 of the second battery cell 220; the third wiring 53 is electrically connected to the negative terminal 222 of the fourth battery cell 220; the fourth wiring 54 is electrically connected to the negative terminal 222 of the sixth battery cell 220; the fifth wiring 55 is electrically connected to the negative terminal 222 of the eighth battery cell 220; and the sixth wiring 56 is electrically connected to the negative terminal 222 of the tenth battery cell 220.

In the back wiring section 44, the first wiring 51 is electrically connected to the negative terminal 222 of the first battery cell 220; the second wiring 52 is electrically connected to the positive terminal 221 of the second battery cell 220; the third wiring 53 is electrically connected to the positive terminal 221 of the fourth battery cell 220; the fourth wiring 54 is electrically connected to the positive terminal 221 of the sixth battery cell 220; the fifth wiring 55 is electrically connected to the positive terminal 221 of the eighth battery cell 220; and the sixth wiring 56 is electrically connected to the positive terminal 221 of the tenth battery cell 220.

In the first battery stack 211, as shown in FIG. 1, the positive terminal 221 of the first battery cell 220 and the negative terminal 222 of the second battery cell 220 are connected in series. Therefore, one of the first wiring 51 and the second wiring 52 of the front wiring section 43 of the first wiring section 41 may not be electrically connected to the corresponding electrode.

FIG. 2 shows only one wire connected between the positive terminal 221 of the first battery cell 220 and the negative terminal 222 of the second battery cell 220 in the first battery stack 211. If expressed by the number described later, only one wiring connecting between No. 1 electrode and No. 2 electrode is shown.

Which one of the first wiring 51 and the second wiring 52 is electrically connected to the corresponding electrode can be determined by disturbance and the like of the alignment of the battery cells 220 in the longitudinal direction of the first battery stack 211. One of the first wiring 51 and the second wiring 52, which becomes electrically unnecessary, may be removed.

Further, in the second battery stack 212, the negative terminal 222 of the first battery cell 220 and the positive terminal 221 of the second battery cell 220 are connected in series as shown in FIG. 1. Therefore, one of the first wiring 51 and the second wiring 52 of the back wiring section 44 of the first wiring section 41 may not be electrically connected to the corresponding electrode.

FIG. 2 shows only one wire connected between the positive terminal 221 of the first battery cell 220 and the negative terminal 222 of the second battery cell 220 in the second battery stack 212. If expressed by the number described later, only one wiring connecting between No. 37 electrode and No. 38 electrode is shown.

Which one of the first wiring 51 and the second wiring 52 is electrically connected to the corresponding electrode can be determined by disturbance and the like of the alignment of the battery cells 220 in the longitudinal direction of the second battery stack 212. One of the first wiring 51 and the second wiring 52, which becomes electrically unnecessary, may be removed.

As described above, the first battery stack 211 and the second battery stack 212 each have ten battery cells 220, and these are connected in series. Therefore, the total number of the positive terminals 221 and the negative terminals 222 of the twenty battery cells 220 becomes 40.

As shown in FIG. 1 and FIG. 2, these 40 electrode terminals are numbered such that the number increases as going from the lowest potential to the highest potential. As the number of numbers (No.) shown in the figure increases, the potential (voltage) of the electrode terminal increases.

In the front wiring section 43 of the first wiring section 41, the first wiring 51 is electrically connected to the No. 1 electrode terminal; the second wiring 52 is electrically connected to the No. 2 electrode terminal; the third wiring 53 is electrically connected to the No. 6 electrode terminal; the fourth wiring 54 is electrically connected to the No. 10 electrode terminal; the fifth wiring 55 is electrically connected to the No. 14 electrode terminal; and the sixth wiring 56 is electrically connected to the No. 18 electrode terminal.

As described above, in the front wiring section 43 of the first wiring section 41, the first wiring 51 or the second wiring 52 need not be electrically connected to the corresponding electrode.

In the back wiring section 44 of the first wiring section 41, the first wiring 51 is electrically connected to the No. 0 electrode terminal; the second wiring 52 is electrically connected to the No. 3 electrode terminal; the third wiring 53 is electrically connected to the No. 7 electrode terminal; the fourth wiring 54 is electrically connected to the No. 11 electrode terminal; the fifth wiring 55 is electrically connected to the No. 15 electrode terminal; and the sixth wiring 56 is electrically connected to the No. 19 electrode terminal.

In FIG. 2, the first wiring section 41 is uniformly denoted by reference numeral 41 in order to avoid complication of notation due to duplication of labels. In the second wiring section 42, the reference numeral 42 is also repeated in the same manner.

As described above, the first wiring 51, the second wiring 52, the third wiring 53, the fourth wiring 54, the fifth wiring 55, and the sixth wiring 56 are electrically connected from the electrode terminal on the lowest potential side toward the electrode terminal on the highest potential side in this order.

Figure 6:
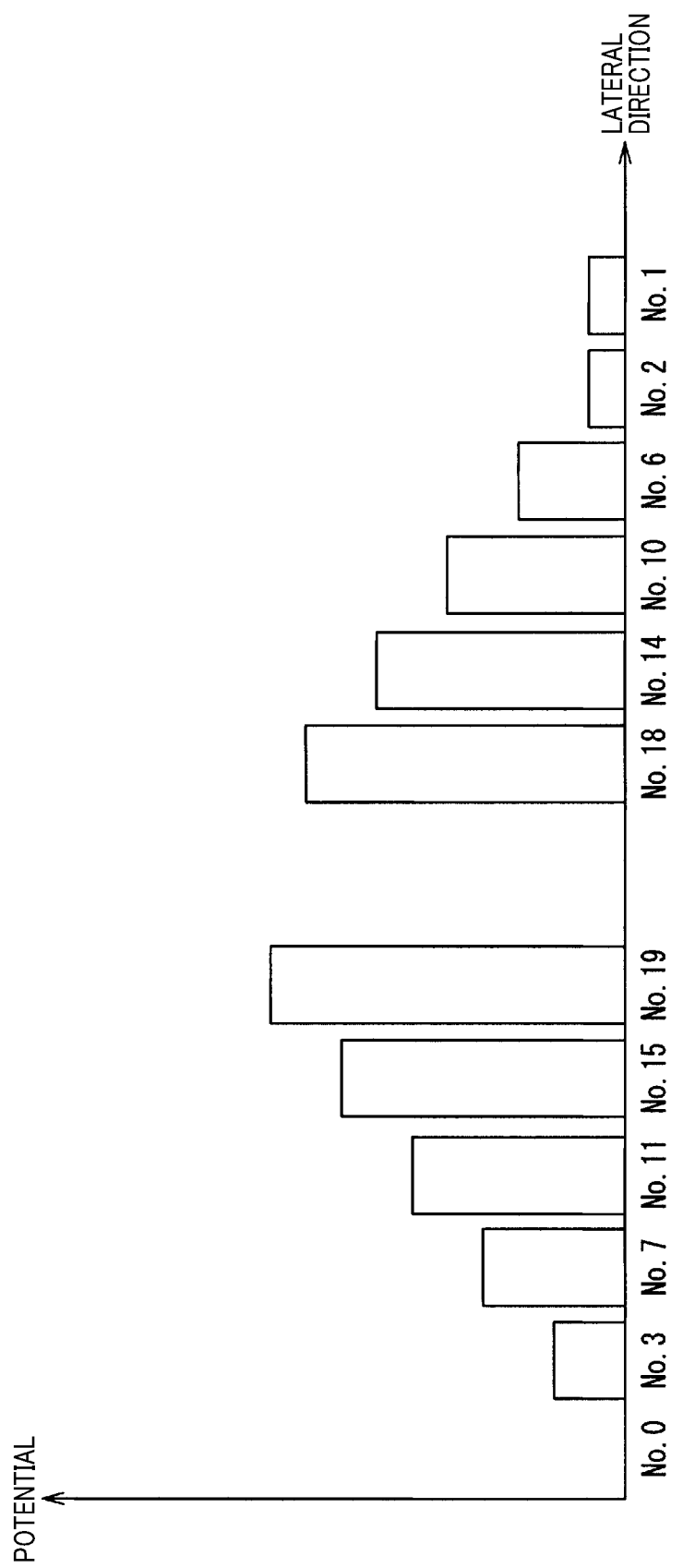
FIG. 6 shows a graph for explaining potential distribution of a first wiring section.

As a result, the potential distribution shown in FIG. 6 is formed in the lateral section 61 aligned in the lateral direction of the first wiring section 41.

The potential difference between the adjacent wirings is 1V or 2V, assuming that the voltage of one battery cell 220 is V. This potential distribution is the same for the longitudinal section 60 aligned in the longitudinal direction. In FIG. 6, the potential of No. 0 is set to zero.

Similarly, the second wiring section 42 is also electrically connected to the electrode terminal.

It should be noted that, as described above, in the back wiring section 44 of the second wiring section 42, the first wiring 51 or the second wiring 52 does not have to be electrically connected to the corresponding electrode.

In the second wiring section 42, unlike the first wiring section 41, the first wiring 51, the second wiring 52, the third wiring 53, the fourth wiring 54, the fifth wiring 55, and the sixth wiring 56 are electrically connected from the electrode terminal on the highest potential side toward the electrode terminal on the lowest potential side in this order.

Figure 7:
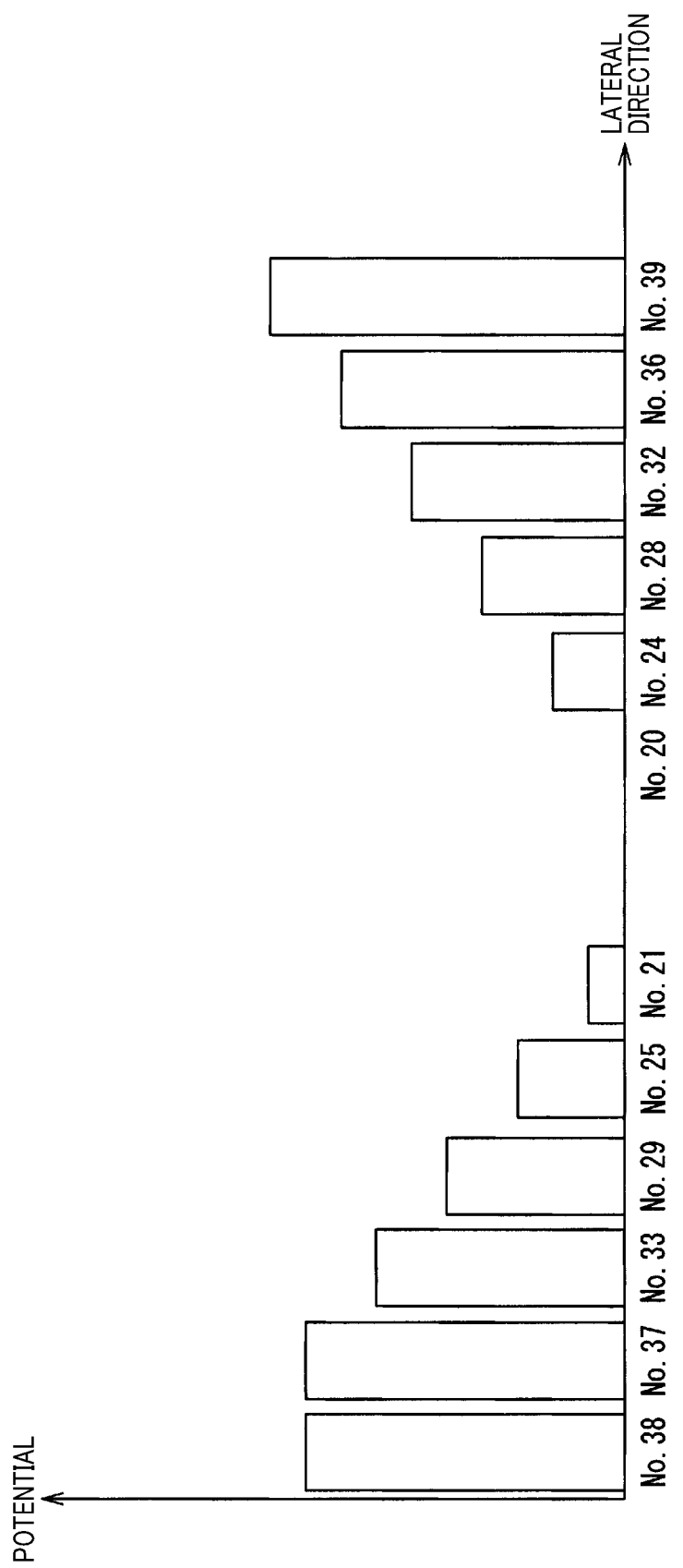
FIG. 7 shows a graph for explaining potential distribution of a second wiring section.

Therefore, the potential distribution shown in FIG. 7 is formed in the lateral section 61 aligned in the lateral direction of the second wiring section 42.

The potential difference between adjacent wirings is 1V or 2V. This potential distribution is the same for the longitudinal section 60 aligned in the longitudinal direction. In FIG. 7, the potential of No. 20 is set to zero.

Next, the monitoring section 10 will be described.

As shown in FIG. 2, the printed circuit board 13 has the board wirings 16 corresponding to the electrodes of the No. 0 to No. 39. These board wirings 16 are electrically connected to one ends of the respective lateral sections 61 described above.

Further, the board wirings 16 are electrically connected to the monitoring IC chip 15.

It should be noted that, as described above, when one of the first wiring 51 and the second wiring 52 of the front wiring section 43 of the first wiring section 41 is removed, the remaining wirings and the corresponding board wirings 16 are electrically connected. When the first wiring 51 and the second wiring 52 of the front wiring section 43 of the first wiring section 41 remain, they are electrically connected to the corresponding board wirings 16.

Similarly, when one of the first wiring 51 and the second wiring 52 of the back wiring section 44 of the second wiring section 42 is removed, the remaining wirings and the corresponding board wirings 16 are electrically connected. When the first wiring 51 and the second wiring 52 of the back wiring section 44 of the second wiring section 42 remain, they are electrically connected to the corresponding board wirings 16.

The monitoring section 10 has a Zener diode 17, a parallel capacitor 18, and a resistor 19 as the electronic element 14. As shown in FIG. 2, a fuse 48 and an inductor 49 are disposed in the wiring of the wiring section 40.

In the following description, a wiring formed by the wiring pattern 46 connecting the adjacent series-connected battery cells 220 and the board wiring 16 is referred to as a voltage detection wiring for the sake of simplicity. The same number of voltage detection wirings as the electrode terminals are formed.

The fuse 48, the inductor 49, and the resistor 19 are disposed for each of the voltage detection wirings. The fuse 48, the inductor 49, and the resistor 19 are connected in series in this order from the battery cell 220 toward the monitoring IC chip 15.

Each of the Zener diode 17 and the parallel capacitor 18 is connected in parallel between two adjacent voltage detection wirings. Specifically, the Zener diode 17 and the parallel capacitor 18 are connected between the inductor 49 and the resistor 19 in the voltage detection wirings.

An anode electrode of the Zener diode 17 is connected to the low potential side. A cathode electrode of the Zener diode 17 is connected to the high potential side.

The Zener diode 17 and the parallel capacitor 18 are mounted on the printed circuit board 13.

The Zener diode 17 has a structure that causes short-circuit failure when an overvoltage is applied from the battery module 200. Specifically, the Zener diode 17 has a structure in which a PN junction type IC chip is sandwiched directly by a pair of leads.

Thereby, unlike a configuration in which an IC chip and a lead are connected via a wire, the wire is broken by application of an overvoltage, thus avoiding open failure of the Zener diode 17.

When the Zener diode 17 is short-circuited due to an overvoltage, the fuse 48 is configured to be broken by a large current flowing through the voltage detection wiring. The rated current of the fuse 48 is set based on a large current flowing through the voltage detection wiring when the Zener diode 17 is short-circuited due to overvoltage.

Further, the resistor 19 and the parallel capacitor 18 constitute an RC circuit. The RC circuit and the inductor 49 function as a filter for removing noise when detecting the voltages.

In addition, the resistor 19 constituting the RC circuit functions as a current limiting resistor during an equalization processing which will be described later.

Although not shown, the monitoring IC chip 15 has a microcomputer and switches corresponding to each of the plurality of battery cells 220. The switch controls a connection between the two voltage detection wirings.

Therefore, charging and discharging of the battery cells 220 electrically connected to the corresponding voltage detection wirings is controlled by controlling opening/closing of the switch.

Performances and characteristics of each battery cell 220 are different from each other due to product variation.

Therefore, when charging and discharging are repeated, a state of charge (SOC) of each battery cell 220 varies. The SOC has a correlation with the induced voltage of the battery cell 220.

Due to the nature of the battery cell 220, over-discharge and over-charge must be suppressed from being generated. In other words, over-discharge and over-charge are extremely low and high values respectively of the SOC.

The SOC of each battery cell 220 varies means that a degree of over-discharge and over-charge of each battery cell 220 also varies.

Therefore, in order to accurately control the SOC so that the SOC of the battery stack 210 does not become over-discharged or over-charged, it is necessary to equalize the SOCs of the plurality of battery cells 220 constituting the battery stack 210. In other words, it is necessary to match the SOC of each of the plurality of battery cells 220 with the SOC of the battery stack 210, which is the total average of the SOCs of the battery cells 220.

Because of such a requirement, the microcomputer of the monitoring IC chip 15 detects and monitors the output voltage (induced voltage) of each of the plurality of battery cells 220. This output voltage is inputted to the battery ECU 300.

The battery ECU 300 stores a correlation between the SOC and induced voltage. The battery ECU 300 detects the SOC of each of the plurality of battery cells 220 based on the inputted output voltage (induced voltage) and the stored correlation.

The battery ECU 300 determines the equalization processing of the SOCs of the plurality of battery cells 220 based on the detected SOCs. Then, the battery ECU 300 outputs an instruction for the equalization processing based on the determination to the microcomputer of the monitoring IC chip 15.

The microcomputer controls opening and closing of switches corresponding to each of the plurality of battery cells 220 based on the instruction for the equalization processing. Thereby, the equalization processing is executed.

Note that the battery ECU 300 also detects a SOC of the battery stack 210 based on the inputted voltage and the like. The battery ECU 300 outputs the detected SOC of the battery stack 210 to the in-vehicle ECU.

The in-vehicle ECU outputs a command signal to the battery ECU 300 based on the SOC, vehicle information such as a depression amount of an accelerator pedal and a throttle valve opening angle inputted from various sensors mounted on the vehicle, and an ignition switch or the like. The battery ECU 300 controls the connection between the battery pack 400 and the electric load 500 based on this command signal.

[Functions and Effects]

Next, functions and effects of the monitoring device 100 of the battery pack 400 will be described.

As described above, the front wiring section 43 and the back wiring section 44 have the flexible circuit board 45 and the wiring pattern 46. Then, the both-end wiring pattern 46a and the even-number wiring pattern 46b are formed on the flexible circuit board 45.

Therefore, the first electrode terminal group 211a and the first monitoring section 11 are electrically connected via the front wiring section 43. Further, the second electrode terminal group 211b and the first monitoring section 11 are electrically connected via the back wiring section 44.

Accordingly, the voltages of all the battery cells 220 of the first battery stack 211 can be detected.

Although not described, the voltages of all the battery cells 220 of the second battery stack 212 can also be detected in the same manner.

The front wiring section 43 and the back wiring section 44 have the same flexible circuit board 45 and the wiring pattern 46. Therefore, the front wiring section 43 can be used in place of the back wiring section 44. Similarly, the back wiring section 44 can be used in place of the front wiring section 43.

As described above, the monitoring device 100 is configured to have a versatile wiring section 40.

The battery stack 210 is formed by connecting the plurality of battery cells 220 in series in the longitudinal direction, and therefore, there is a possibility that the alignment thereof is somewhat disturbed due to manufacturing variations. As a result, the alignment of the positive terminal and the negative terminal in each of the first electrode terminal group 211a and the second electrode terminal group 211b may also be somewhat disturbed.

For this, the flexible circuit board 45 on which the wiring pattern 46 is formed has flexibility. Therefore, it is possible to electrically connect the wiring pattern 46 and the electrode terminal by deforming the flexible circuit board 45 accordingly even if disturbance occurs between the positive terminal and the negative terminal.

The lateral length of the lateral section 61 constituting the wiring pattern 46 is longer than the lateral separation distance between the connection end of the longitudinal section 60 to the lateral section 61 and the corresponding electrode terminal group.

According to this, even if a tip of the lateral section 61 and the corresponding electrode terminal are shifted in the longitudinal direction due to manufacturing variations or the like, the lateral section 61 can be electrically connected to the corresponding electrode terminal by deforming the lateral section 61.

As described above, the other end of the lateral section 61 constituting the wiring pattern 46 protrudes out from the flexible circuit board 45 and the coating resin 47 Therefore, even if the front and back surfaces of the flexible circuit board 45 are reversed, the flexible circuit board 45 and the coating resin 47 are not positioned between the end portion of the wiring pattern 46 and the electrode terminal.

This prevents mechanical and electrical connection between the lateral section 61 and the electrode terminal from being difficult.

In the first wiring section 41, the first wiring 51, the second wiring 52, the third wiring 53, the fourth wiring 54, the fifth wiring 55, and the sixth wiring 56 are electrically connected from the electrode terminal on the lowest potential side toward the electrode terminal on the highest potential side in this order.

In the second wiring section 42, unlike the first wiring section 41, the first wiring 51, the second wiring 52, the third wiring 53, the fourth wiring 54, the fifth wiring 55, and the sixth wiring 56 are electrically connected from the electrode terminal on the highest potential side toward the electrode terminal on the lowest potential side in this order.

Therefore, as shown in FIG. 6, the potential difference between the adjacent wirings is 1V or 2V in the lateral section 61 aligned in the lateral direction of the first wiring section 41.

Likewise, as shown in FIG. 7, the potential difference between the adjacent wirings is 1V or 2V in the lateral section 61 aligned in the lateral direction of the second wiring section 42.

As a result, the potential difference between adjacent wirings in the lateral direction is suppressed from increasing. Therefore, as a result of an increase in the number of the battery cells 220 constituting the battery stack 210, capacitive coupling between the wirings is suppressed from occurring even if the number of the wirings is increased and the separation distance of the wirings is shortened.

Although the preferred embodiment of the present disclosure has been described above, the present disclosure is not limited to the above-described embodiment in any way, and various modifications can be made without departing from the scope of the present disclosure.

[First Modification]

It should be appreciated that, in the first modification and the subsequent modifications, components identical with or similar to those in the above embodiment are given the same reference numerals, unless otherwise indicated, and repeated structures and features thereof will not be described in order to avoid redundant explanation.

In the above embodiment, an example is shown in which the wiring pattern 46 is formed on the front surface 45a of the flexible circuit board 45.

Figure 8:
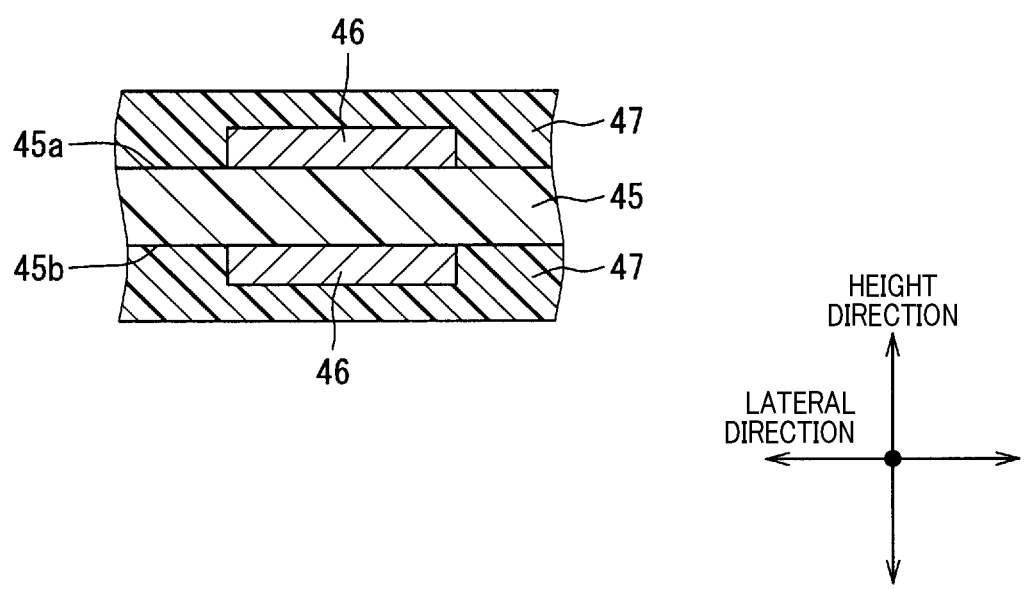
FIG. 8 shows a sectional view for explaining a modification of a wiring section.

However, it is also possible to adopt a configuration in which a wiring pattern 46 is formed on each of a front surface 45a and a back surface 45b of a flexible circuit board 45, as shown in FIG. 8.

It should be noted that the wiring patterns 46 formed on the front surface 45a and the back surface 45b are opposite to each other with a thickness of the flexible circuit board 45 in the height direction in FIG. 8.

However, the flexible circuit board 45 is very thin. Therefore, the wiring patterns 46 formed on the front surface 45a and the rear surface 45b may be arranged so as not to face each other in the height direction as much as possible.

This suppresses capacitive coupling from occurring between the wiring patterns 46 formed on the front surface 45a and the rear surface 45 b.

[Second Modification]

In the above embodiment, an example is shown in which the wiring pattern 46 has the both-end wiring pattern 46a and the even-number wiring pattern 46b.

However, it is also possible to adopt a configuration in which a wiring pattern 46 has a both-end wiring pattern 46a and an odd-number wiring patterns 46c.

This odd-number wiring pattern 46c is connected to electrode terminals of odd-numbered battery cells 220 in an aligning order excluding two battery cells 220 positioned at both ends.

Figure 9:
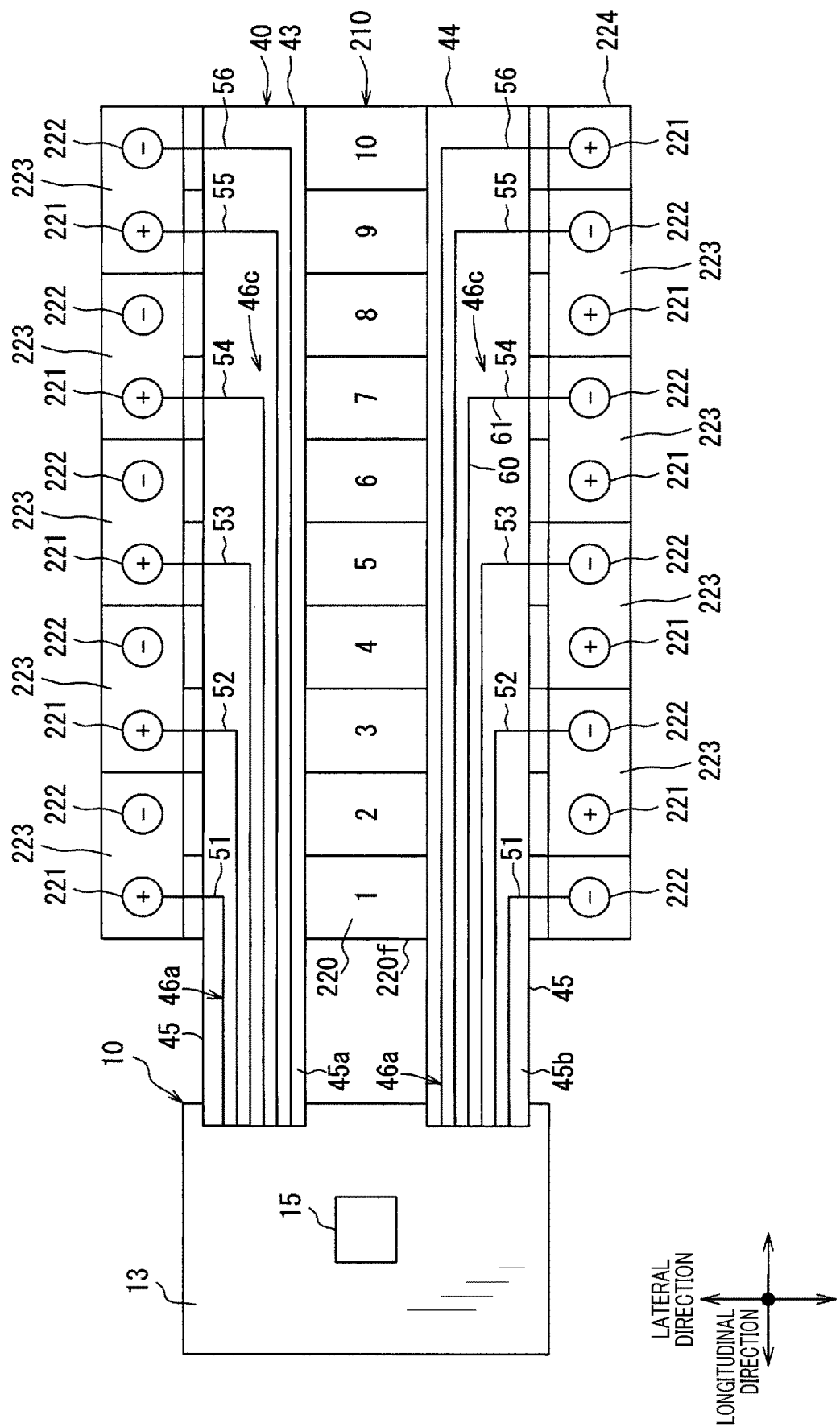
FIG. 9 shows a top view for explaining odd-number wiring patterns.

FIG. 9 shows an example of the odd-number wiring pattern 46c.

In a front wiring section 43, a first wiring 51 is electrically connected to a positive terminal 221 of the first battery cell 220; a second wiring 52 is electrically connected to a positive terminal 221 of a third battery cell 220; a third wiring 53 is electrically connected to a positive terminal 221 of a fifth battery cell 220; a fourth wiring 54 is electrically connected to a positive terminal 221 of a seventh battery cell 220; a fifth wiring 55 is electrically connected to a positive terminal 221 of a ninth battery cell 220; and a sixth wiring 56 is electrically connected to a negative terminal 222 of the tenth battery cell 220.

In a back wiring section 44, a first wiring 51 is electrically connected to a negative terminal 222 of the first battery cell 220; a second wiring 52 is electrically connected to a negative terminal 222 of the third battery cell 220; a third wiring 53 is electrically connected to a negative terminal 222 of the fifth battery cell 220; a fourth wiring 54 is electrically connected to a negative terminal 222 of the seventh battery cell 220; a fifth wiring 55 is electrically connected to a negative terminal 222 of the ninth battery cell 220; and a sixth wiring 56 is electrically connected to the positive terminal 221 of the tenth battery cell 220.

As described above, the voltages of all the battery cells 220 can also be detected by the both-end wiring pattern 46a and the odd-number wiring pattern 46c.

It should be noted that, in the battery stack 210 shown in FIG. 9, the positive terminal 221 of the ninth battery cell 220 and the negative terminal 222 of the tenth battery cell 220 are connected in series.

Accordingly, one of the fifth wiring 55 and the sixth wiring 56 of the front wiring section 43 of the first wiring section 41 may not be electrically connected to the corresponding electrode.

Which one of the fifth wiring 55 and the sixth wiring 56 is electrically connected to the corresponding electrode can be determined by disturbance and the like of the alignment of the battery cells 220 in the longitudinal direction of the battery stack 210. An electrically unnecessary wiring may be removed.

Note that there is no wiring that is electrically unnecessary in this way when the battery stack 210 has an odd-number of battery cells 220. Electrically unnecessary wirings occur when the battery stack 210 has an even-number of battery cells 220.

Although not shown, it is also possible to adopt a configuration in which the wiring pattern 46 has the both-end wiring pattern 46a, the even-number wiring pattern 46b, and the odd-number wiring pattern 46c.

[Third Modification]

In the above embodiment, an example is shown in which is the front wiring section 43 of the second wiring section 42 is connected to the third electrode terminal group 212a, and the back wiring section 44 of the second wiring section 42 is connected to the fourth electrode terminal group 212b is shown in FIG. 1.

Figure 10:
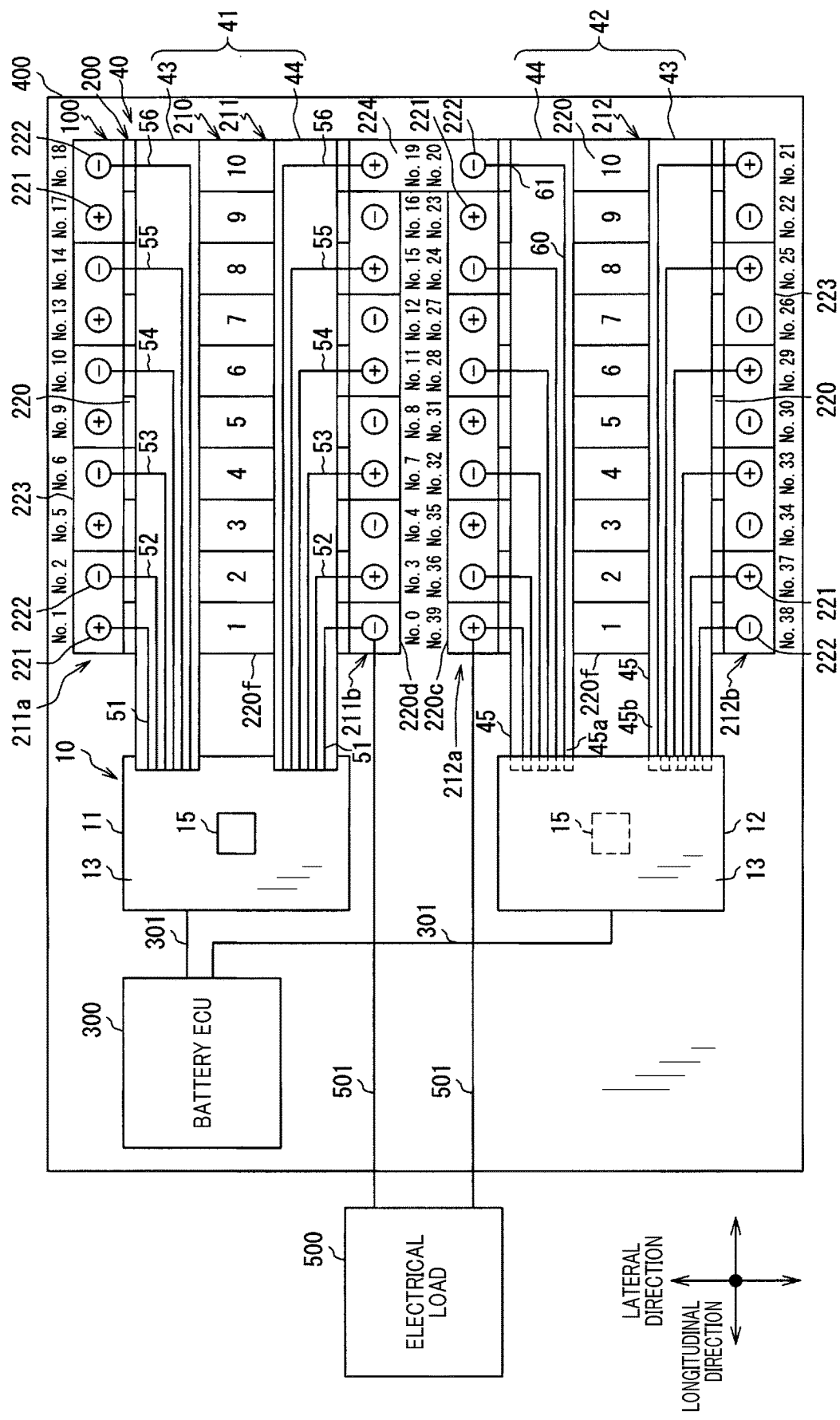
FIG. 10 shows a schematic diagram of a modification of a battery pack.

However, the front and back of a second monitoring section 12 and a second wiring section 42 are reversed, as shown in FIG. 10.

Then, a back wiring section 44 of the second wiring section 42 is connected to a third electrode terminal group 212a and a front wiring section 43 of the second wiring section 42 is connected to a fourth electrode terminal group 212b.

Such a configuration can also be adopted. In this case, a first monitoring device with a first monitoring section 11 connected to the first wiring section 41 and a second monitoring device with a second monitoring section 12 connected to the second wiring section 42 are exactly the same in configuration. In this way, the monitoring device has a high versatility.

[Fourth Modification]

As described above, in the configuration having the even-number wiring pattern 46b, an example is shown in which one of the first wiring 51 and the second wiring 52 becomes unnecessary because of the same potential, and in the configuration having the odd-number wiring pattern 46c, one of the fifth wiring 55 and the sixth wirings 56 becomes unnecessary. The lateral section 61 of the wiring unnecessary for the electrical connection may be removed by using a cutter or the like.

Figure 11:
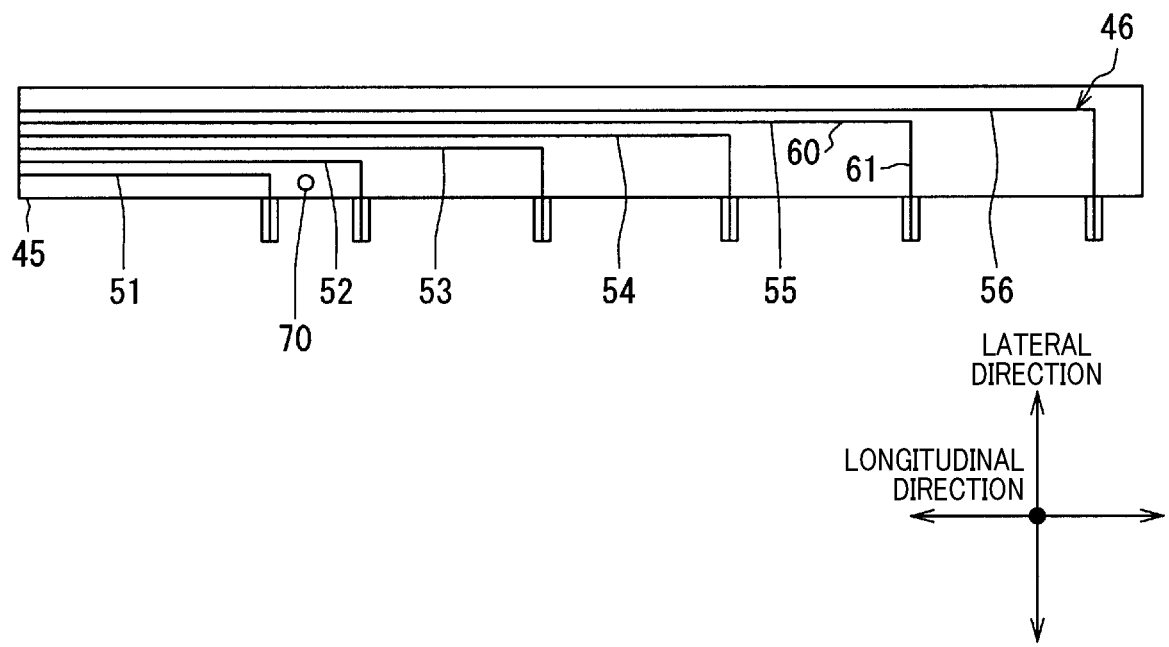
FIG. 11 shows a top view for explaining fixing electrodes.
Figure 12:
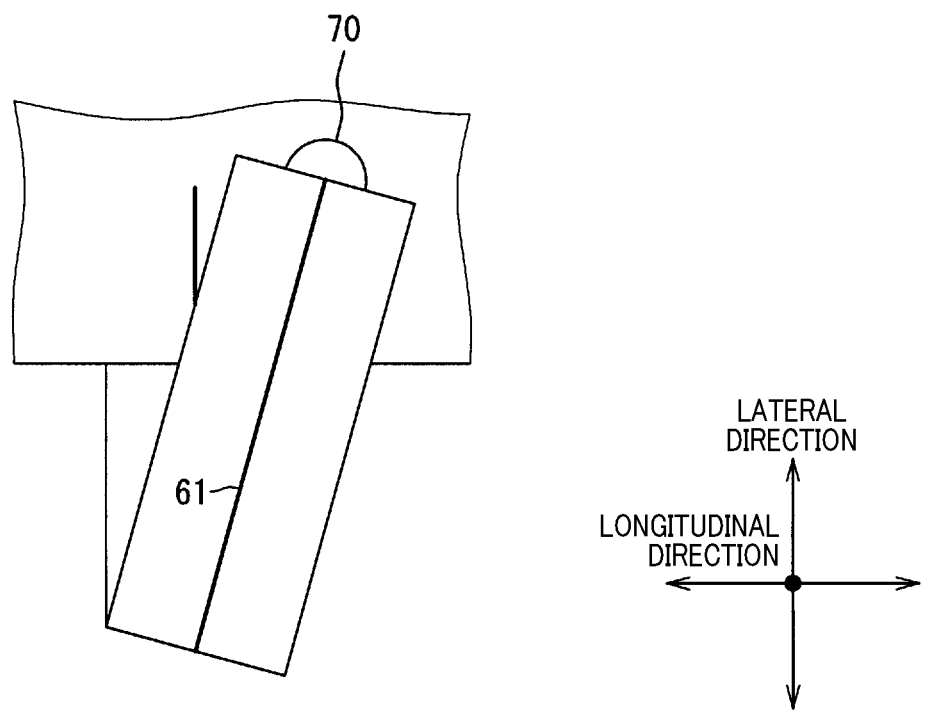
FIG. 12 shows a top view of a fixation of connecting wires unnecessary for electrical connection.

Further, as shown in FIG. 11, a metal fixing electrode 70 for welding and fixing a lateral section 61 unnecessary for an electrical connection to a flexible circuit board 45 may be formed on the flexible circuit board 45. In this case, a tip of a lateral section 61 unnecessary for the electrical connection is bent toward the fixing electrode 70 to bring them into contact with each other, as shown in FIG. 12. In this contact state, the lateral section 61 and the fixing electrode 70 are welded.

As a result, it is possible to prevent a portion that is not electrically connected by the lateral section 61 unnecessary for electrical connection from being connected. This removal of the unnecessary lateral section 61 can be performed when the wiring section 40 is connected to the battery stack 210.

[Fifth Modification]

As shown in FIGS. 11 and 12, it is also possible to adopt a configuration in which the tip of the lateral section 61 rests on the flexible circuit board 45. It is also possible to adopt a configuration in which the tip of the lateral section 61 is covered with a coating resin 47.

[Sixth Modification]

Figure 13:
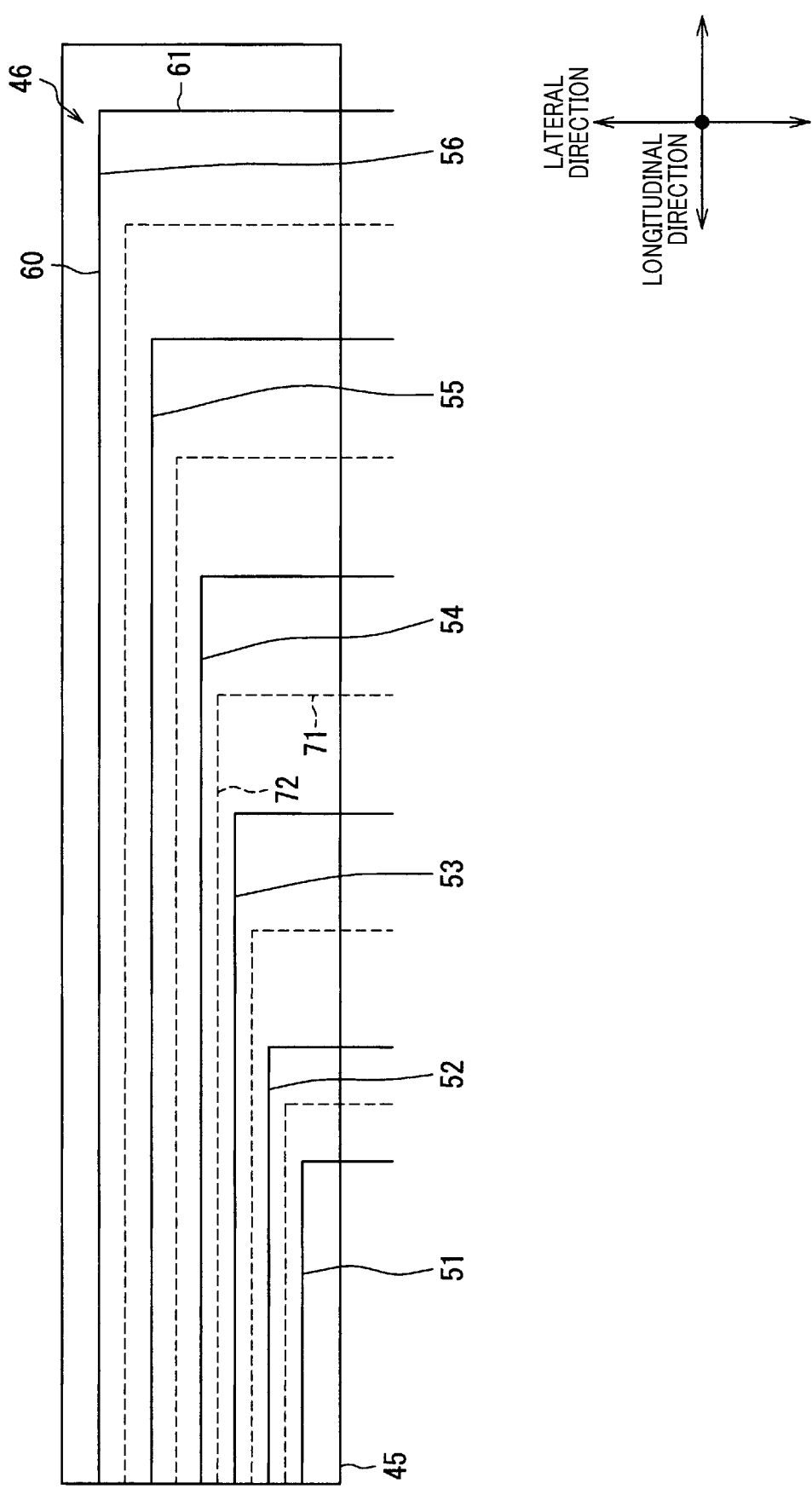
FIG. 13 shows a top view for explaining a modification of a wiring section.

A wiring pattern 46 may have preliminary lateral sections 71 for electrically connecting to electrode terminals and preliminary longitudinal sections 72 for electrically connecting the preliminary lateral sections 71 and a monitoring section 10, which are indicated by broken lines in FIG. 13. The preliminary lateral sections 71 are disposed in the longitudinal direction together with lateral sections 61. In FIG. 13, the preliminary lateral sections 71 are positioned between a plurality of lateral sections 61 in the lateral direction.

When the number of battery cells 220 constituting the battery stack 210 increases or decreases, or the size of the battery cell 220 changes, a relative position between the lateral section 61 and a corresponding electrode terminal is shifted in the longitudinal direction. Therefore, there is a possibility that the lateral section 61 and the corresponding electrode terminal cannot be electrically connected to each other.

Further, there is another possibility that the lateral section 61 and the corresponding electrode terminal cannot be electrically connected to each other by changing an electrical connection form of the battery cell 220 constituting the battery stack 210.

However, the wiring pattern 46 of the present modification has the preliminary lateral sections 71 aligned in the longitudinal direction with the lateral sections 61.

According to this, the electrode terminal of the battery cell 220 and the monitoring section 10 can be electrically connected by the preliminary lateral sections 71 in place of the lateral sections 61 which are difficult to connect.

[Seventh Modification]

In the above embodiment, an example is shown in which the monitoring device 100 includes the first monitoring section 11 corresponding to the first battery stack 211 and the second monitoring section 12 corresponding to the second battery stack 212.

Figure 14:
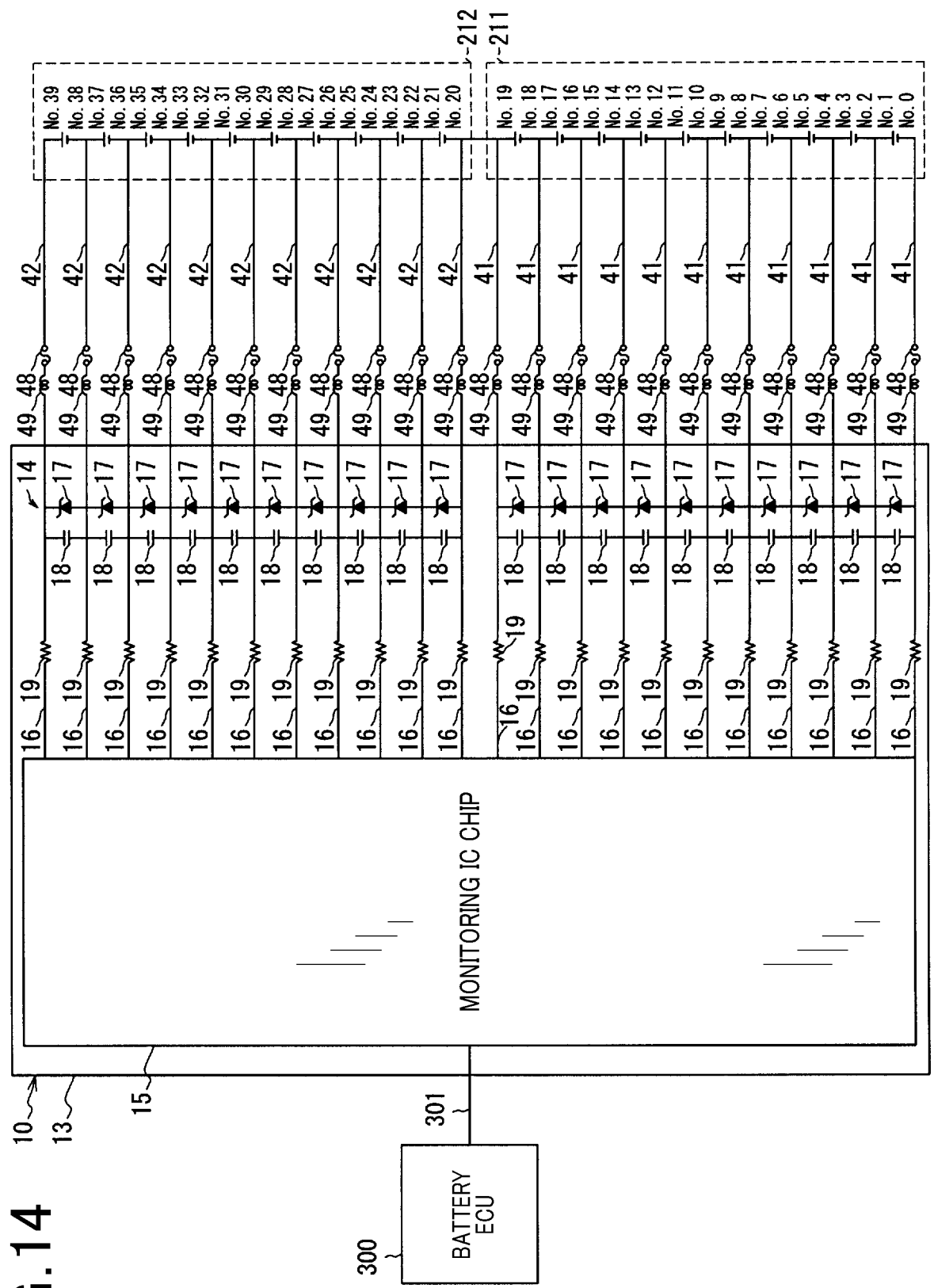
FIG. 14 shows a circuit diagram for explaining a modification of a monitoring section.

However, as shown in FIG. 14, a monitoring device 100 may have monitoring sections 10 corresponding to both first battery stack 211 and second battery stack 212. The monitoring section 10 also includes a printed circuit board 13, electronic elements 14, and a monitoring IC chip 15.

[Other Modifications]

In the above embodiment, an example in which the battery pack 400 is applied to the hybrid vehicle is shown. However, the battery pack 400 can also be applied to, for example, plug-in hybrid vehicles and electric cars.

In the above embodiment, the battery module 200 includes the first battery stack 211 and the second battery stack 212. However, it is also possible to adopt a configuration in which the battery module 200 further includes other battery stacks.

For example, a configuration in which the battery module 200 has four battery stacks can be adopted. Alternatively, the battery module 200 may have a configuration having one battery stack.

What is claimed is:

1. A monitoring device comprising:
a monitoring section that monitors a voltage of each of a plurality of battery cells of a battery stack in which the plurality of battery cells are electrically and mechanically connected in series in a longitudinal direction orthogonal to a height direction passing through an upper surface of a battery cell where electrode terminals are formed; and
a wiring section electrically connecting the monitoring section and the plurality of battery cells; wherein
each battery cell of the plurality of battery cells has a positive terminal and a negative terminal as the electrode terminals aligned in a lateral direction orthogonal to the height direction and the longitudinal direction;
a first electrode terminal group in which a plurality of the positive terminals and the negative terminals are aligned and alternate in the longitudinal direction and a second electrode terminal group in which the negative terminal and the positive terminal are aligned and alternate in the longitudinal direction are formed in the battery stack by aligning the plurality of the battery cells in the longitudinal direction;
the first electrode terminal group and the second electrode terminal group are aligned in the lateral direction;
the wiring section has a first wiring section and a second wiring section;
each of the first wiring section and the second wiring section has a flexible circuit board having flexibility and a wiring pattern formed on the flexible circuit board;
each of the first wiring section and the second wiring section has the flexible circuit board having the same shape and the wiring pattern having the same shape;
the wiring pattern has both-end wiring patterns and at least one of an even-number wiring pattern and an odd-number wiring pattern, the both-end wiring patterns are electrically connected to electrode terminals of two battery cells positioned at both ends of the plurality of battery cells aligned in the longitudinal direction, the even-number wiring patterns are connected to electrode terminals of even-numbered battery cells in an aligning order excluding the two battery cells positioned at both ends, the odd-number wiring pattern is connected to electrode terminals of odd-numbered battery cells in the aligning order excluding two battery cells positioned at both ends;
the first electrode terminal group and the monitoring section are electrically connected via the wiring pattern of one of the first wiring section and the second wiring section; and
the second electrode terminal group and the monitoring section are electrically connected via the wiring pattern of another one of the first wiring section and the second wiring section.

2. The monitoring device according to claim 1, wherein the wiring pattern of each of the first wiring section and the second wiring section includes a plurality of lateral sections electrically connected to corresponding electrode terminals and a plurality of longitudinal sections electrically connect the plurality of lateral sections and the monitoring section;
the first wiring section and the second wiring section face the upper surface of the battery cell in the height direction and are aligned in the lateral direction between the first electrode terminal group and the second electrode terminal group;
the lateral section of the wiring pattern of one of the first wiring section and the second wiring section is positioned between the longitudinal section of the wiring pattern of one of the first wiring section and the second wiring section and the first electrode terminal group in the lateral direction;
the lateral section of the wiring pattern of the other one of the first wiring section and the second wiring section is positioned between the longitudinal section of the wiring pattern of the other one of the first wiring section and the second wiring section and the second electrode terminal group in the lateral direction;
a length between a connection end of the lateral section and a tip opposite to the connection end is longer than a separation distance between the connection end and the corresponding electrode terminal in the lateral direction.

3. The monitoring device according to claim 2, wherein a back surface of the flexible circuit board of one of the first wiring section and the second wiring section faces the upper surface of the battery cell in the height direction;
a front surface of the flexible circuit board of the other one of the first wiring section and the second wiring section faces the upper surface of the battery cell in the height direction; and
the lateral section protrudes out from the flexible circuit board.

4. The monitoring device according to claim 3, wherein the wiring pattern of each of the first wiring section and the second wiring section has a preliminary lateral section for electrically connecting with the electrode terminal and a preliminary longitudinal section for preliminarily connecting the preliminary lateral section and the monitoring section; and
the preliminary lateral section is aligned in the longitudinal direction together with the lateral section.

5. The monitoring device according to claim 4, wherein the wiring pattern is formed on a front surface and a back surface of the flexible circuit board of each of the first wiring section and the second wiring section.

6. The monitoring device according to claim 3, wherein the wiring pattern is formed on a front surface and a back surface of the flexible circuit board of each of the first wiring section and the second wiring section.

7. The monitoring device according to claim 2, wherein the wiring pattern of each of the first wiring section and the second wiring section has a preliminary lateral section for electrically connecting with the electrode terminal and a preliminary longitudinal section for preliminarily connecting the preliminary lateral section and the monitoring section; and the preliminary lateral section is aligned in the longitudinal direction together with the lateral section.

8. The monitoring device according to claim 7, wherein the wiring pattern is formed on a front surface and a back surface of the flexible circuit board of each of the first wiring section and the second wiring section.

9. The monitoring device according to claim 2, wherein the wiring pattern is formed on a front surface and a back surface of the flexible circuit board of each of the first wiring section and the second wiring section.

10. The monitoring device according to claim 1, wherein the wiring pattern is formed on a front surface and a back surface of the flexible circuit board of each of the first wiring section and the second wiring section.

\* \* \* \* \*